United States Patent
Choi et al.

(10) Patent No.: US 12,438,054 B2
(45) Date of Patent: Oct. 7, 2025

(54) SEMICONDUCTOR DEVICE INCLUDING A MACRO PATTERN STRUCTURE FOR MONITORING OF LINE WIDTHS

(71) Applicant: Samsung Electronics Co., Ltd., Suwon-si (KR)

(72) Inventors: Jungkee Choi, Hwaseong-si (KR); Sangwoo Park, Suwon-si (KR); Woonhyuk Choi, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 450 days.

(21) Appl. No.: 18/149,974

(22) Filed: Jan. 4, 2023

(65) Prior Publication Data
US 2023/0253267 A1 Aug. 10, 2023

(30) Foreign Application Priority Data
Feb. 4, 2022 (KR) .................. 10-2022-0014738

(51) Int. Cl.
*H01L 21/66* (2006.01)

(52) U.S. Cl.
CPC .............. *H01L 22/12* (2013.01); *H01L 22/34* (2013.01)

(58) Field of Classification Search
None
See application file for complete search history.

(56) References Cited

U.S. PATENT DOCUMENTS

| | | | |
|---|---|---|---|
| 7,907,268 B2 | 3/2011 | Fujimori et al. | |
| 8,064,681 B2 | 11/2011 | Okai et al. | |
| 8,121,390 B2* | 2/2012 | Nagano | G06V 10/7515 382/141 |
| 8,347,240 B2 | 1/2013 | Agarwal et al. | |
| 8,948,495 B2 | 2/2015 | Marcuccilli et al. | |
| 9,355,921 B2 | 5/2016 | Yamashita et al. | |
| 10,068,323 B2 | 9/2018 | Sah et al. | |
| 10,957,555 B2 | 3/2021 | Huang et al. | |
| 11,062,926 B2* | 7/2021 | Wu | H01L 22/20 |
| 2005/0282360 A1* | 12/2005 | Kida | H01L 21/78 257/E23.179 |
| 2009/0217224 A1 | 8/2009 | Wiaux et al. | |
| 2012/0276664 A1* | 11/2012 | Markwort | H01L 22/20 257/E21.527 |
| 2013/0069206 A1* | 3/2013 | Yoshizawa | H01L 21/78 257/E23.179 |

(Continued)

FOREIGN PATENT DOCUMENTS

| | | |
|---|---|---|
| JP | 2013-0236031 A | 11/2013 |
| KR | 10-1703788 B1 | 2/2017 |

*Primary Examiner* — Alexander G Ghyka
(74) *Attorney, Agent, or Firm* — Fish & Richardson P.C.

(57) ABSTRACT

A semiconductor device may include a metal pattern in a device region of a substrate, and a macro pattern structure in a scribe lane region of the substrate. The macro pattern structure may include a plurality of types of macro patterns. Each type of macro pattern may include a color 1 pattern and a color 2 pattern adjacent to the color 1 pattern. The color 1 pattern and the color 2 pattern may include conductive lines extending in a first direction parallel to a surface of the substrate. The color 1 pattern and color 2 pattern may be alternately arranged in a second direction perpendicular to the first direction and parallel to the surface of the substrate.

20 Claims, 16 Drawing Sheets

(56) References Cited

U.S. PATENT DOCUMENTS

| | | | |
|---|---|---|---|
| 2014/0253137 A1* | 9/2014 | Chuang | H01L 22/30 |
| | | | 324/750.01 |
| 2020/0105629 A1* | 4/2020 | Chen | G03F 7/70633 |
| 2022/0181271 A1* | 6/2022 | Rajoo | H01L 23/585 |

* cited by examiner

SEMICONDUCTOR DEVICE INCLUDING A MACRO PATTERN STRUCTURE FOR MONITORING OF LINE WIDTHS

CROSS-REFERENCE TO RELATED APPLICATION

This application claims priority under 35 USC § 119 to Korean Patent Application No. 10-2022-0014738, filed on Feb. 4, 2022, in the Korean Intellectual Property Office (KIPO), the contents of which are incorporated by reference herein in their entirety.

BACKGROUND

Various example embodiments relate to a semiconductor device including a macro pattern structure for monitoring of line widths and/or a method for monitoring of the line widths using the macro pattern structure. More particularly, various example embodiments relate to a semiconductor device including a macro pattern structure for monitoring of line widths of metal patterns formed by a double patterning process, and/or a method for monitoring of line widths using the macro pattern structure.

In the manufacture of semiconductor devices, a double patterning process may be performed to form fine patterns having a narrow line width. When the fine patterns are formed by the double patterning process, a defect in which line widths of neighboring patterns are not the same and asymmetric to each other may occur. Thus, a method for easily monitoring of the defect in which the line widths of the neighboring patterns are asymmetric to each other may be required or desired.

SUMMARY

Various example embodiments provide a semiconductor device including a macro pattern structure for monitoring of line widths.

According to various example embodiments, there may be provided a semiconductor device. The semiconductor device may include a metal pattern within a device region of a substrate, and a macro pattern structure within a scribe lane region of the substrate. The macro pattern structure may include a plurality of types of macro patterns. Each type of macro pattern may include a color 1 pattern and a color 2 pattern adjacent to the color 1 pattern. The color 1 pattern and the color 2 pattern may include conductive lines extending in a first direction parallel to a surface of the substrate. The color 1 pattern and color 2 pattern may be alternately arranged in a second direction perpendicular to the first direction and parallel to the surface of the substrate.

According to various example embodiments, there may be provided a semiconductor device. The semiconductor device may include a metal pattern within a device region of a substrate, and a macro pattern structure within a scribe lane region of the substrate. The macro pattern structure may include first to fifth types of macro patterns. The first to fifth types of macro patterns may include a color 1 pattern and a color 2 pattern adjacent to the color 1 pattern. The color 1 pattern and the color 2 pattern may include conductive lines extending in a first direction parallel to a surface of the substrate. The color 1 pattern and the color 2 pattern may be alternately arranged in a second direction perpendicular to the first direction and parallel to the surface of the substrate. The conductive lines included in the first to third types of macro patterns may have a first length in the first direction.

In the fourth and fifth types of macro patterns, the conductive line corresponding to the color 1 pattern may have a second length in the first direction less than the first length, and the conductive line corresponding to the color 2 pattern may have the first length in the first direction.

According to some example embodiments, there may be provided a semiconductor device. The semiconductor device may include a first group of macro patterns in a unit standard cell region and a second group of macro patterns in the unit standard cell region. The first group of macro patterns may include three or five conductive lines extending in a first direction. The conductive lines may be spaced apart from each other in a second direction that is perpendicular to the first direction, and the conductive lines may have a first length in the first direction. The second group of macro pattern may include three conductive lines extending in the first direction. The conductive lines may be spaced apart from each other in the second direction. Two conductive lines among the three conductive lines may have a second length in the first direction less than the first length. The conductive lines included in the first and second group of macro patterns may include a color 1 pattern or a color 2 pattern adjacent to the color 1 pattern.

The semiconductor device in accordance with various example embodiments may include the macro pattern structure. Defects of line widths of metal patterns formed within the device region may be more easily detected by the monitoring of the line widths using the macro pattern structure.

BRIEF DESCRIPTION OF THE DRAWINGS

Various example embodiments will be more clearly understood from the following detailed description taken in conjunction with the accompanying drawings.

FIG. 1 illustrates an example of a layout of metal patterns in a semiconductor device;

FIGS. 2 to 17 are cross-sectional views and plan views illustrating a method of forming metal patterns in a semiconductor device by a double patterning process;

FIGS. 18 to 22 are plan views illustrating macro patterns for monitoring of a line width of a pattern in accordance with various example embodiments;

FIGS. 23 to 25 are plan views illustrating defects occurring in each type of macro pattern for monitoring of line widths of patterns in accordance with various example embodiments;

FIG. 26 is a plan view illustrating a semiconductor chip including a macro pattern structure for monitoring of a line width of a pattern in accordance with various example embodiments; and FIGS. 27 and 28 are flow charts illustrating a method for monitoring of a line width of a pattern in accordance with various example embodiments.

DESCRIPTION OF SOME EXAMPLE EMBODIMENTS

Figure 1:
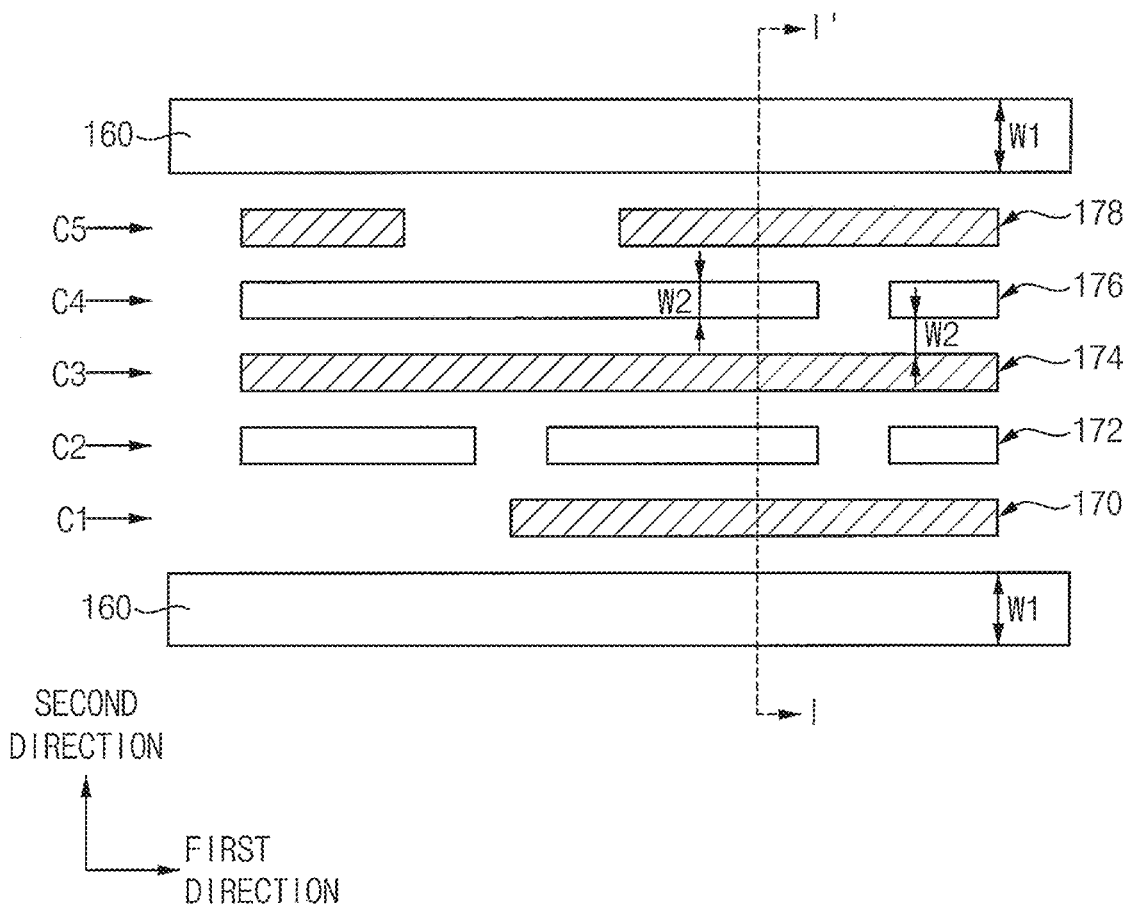
FIGS. 1 to 28 represent non-limiting, example embodiments as described herein.

FIG. 1 illustrates an example of a layout of metal patterns in a semiconductor device.

The semiconductor device may be or may include a logic circuit device, and/or may be or may include a memory device.

Referring to FIG. 1, circuit patterns (not shown) for forming the logic circuit device may be formed on a substrate. The circuit patterns may include, e.g., active and/or passive devices, such as but not limited to transistors and/or capacitors and/or resistors. For example, one of the transistors included in the circuit patterns may include a multi-bridge channel (MBCFET™) transistor. For example, one of the transistors included in the circuit patterns may include a planar transistor, a buried channel array transistor or a fin field effect transistor.

An insulating interlayer (not shown) may be formed on the substrate to cover the circuit patterns.

Metal patterns electrically connected to the circuit patterns may be formed on the insulating interlayer. The metal patterns may be arranged according to a designed layout. FIG. 1 shows an example of a layout of the metal patterns, but the layout of the metal patterns are not limited thereto.

In order to form the metal patterns having a fine line width of about 10 nm or less, the metal patterns may be formed by a double patterning process. An intermetal dielectric layer (e.g., intermetal insulating layer) filling between the metal patterns may be formed on the insulating interlayer.

Hereinafter, the metal patterns may be described.

Power rails 160 extending in a first direction parallel to a surface of the substrate may be formed on the insulating interlayer. The power rails 160 spaced apart from each other in a second direction perpendicular to the first direction, and may be disposed to face each other. Each or at least one of the power rails 160 may have a first line width.

A region between the two power rails 160 facing each other in the second direction may be or may correspond to a conductive line region in which conductive lines are disposed. The conductive lines extending in the first direction may be disposed in the conductive line region.

A number of rows, such as five rows extending in the first direction and spaced apart from each other in the second direction may be included in the conductive line region. For example, the conductive line region may include first to fifth rows C1, C2, C3, C4, and C5 arranged from bottom to top (referring to FIG. 1). At least one conductive line may be disposed on each of rows. First to fifth group of conductive lines 170, 172, 174, 176, and 178 may be disposed at the first to fifth rows C1, C2, C3, C4, and C5, respectively.

A plurality of conductive lines may be included in ones of the first to fifth group of conductive lines 170, 172, 174, 176, and 178, and the plurality of conductive lines may be spaced apart from each other in the first direction.

A conductive line included in the first group of conductive line 170 may be referred to as a first conductive line. A conductive line included in the second group of conductive lines 172 may be referred to as a second conductive line. A conductive line included in the third group of conductive line 174 may be referred to as a third conductive line. A conductive line included in the fourth group of conductive line 176 may be referred to as a fourth conductive line. A conductive line included in the fifth group of conductive line 178 may be referred to as a fifth conductive line.

A width (e.g., spacing) and/or a position of a portion where each of the first to fifth conductive lines are spaced apart from each other in the first direction may vary according to the designed layout of the metal patterns.

Each of the first to fifth conductive lines may have the same line width, which may be a second line width W2. Additionally a distance between the first to fifth conductive lines adjacent to each other in the second direction may be equal to the second line width W2. Furthermore, a distance between the power rail (e.g., upper power rail) and the first conductive line in the second direction and a distance between the power rail (e.g., lower power rail) and the fifth conductive line in the second direction may be equal to the second line width W2. Thus, the first to fifth conductive lines adjacent to each other in the second direction may be spaced apart from each other by the same width as the second line width W2. The second line width W2 may be less than the first line width W1. In various example embodiments, the second line width W2 may be less than about 10 nm, e.g., about 3 nm to about 10 nm.

In order to form the first to fifth conductive lines having the line width of about 10 nm or less, the first to fifth conductive lines may be formed by the double patterning process.

The conductive lines formed at the odd rows C1, C3, and C5 (for example, the first, third, and fifth group of conductive lines 170, 174, and 178) may be formed by a first photo process, and may be classified as a color 1 pattern. The power rails 201 and the conductive lines formed at the even-numbered rows C2 and C4 (for example, the second and fourth group of conductive lines 172 and 176) may be formed by a second photo process, and may be classified as a color 2 pattern. The color 2 pattern may be disposed adjacent to the color 1 pattern. Lines in the color 1 pattern may be interleaved with lines of the color 2 pattern. As used herein, terms such as "color 1" and "color 2" may not refer to a color of the pattern, but may instead be used as labels to identify various patterns having similar features, for example features according to various photo processes.

When the line width of each of the color 1 patterns 170, 174 and 178 is greater than a target line width, the line width of each of the color 2 patterns 172 and 176 may be less than the target line width. Conversely, when the line width of each of the color 1 patterns 170, 174 and 178 is less than the target line width, the line width of each of the color 2 patterns 172 and 176 may be greater than the target line width. As line widths of the color 1 patterns may not be perfectly equal to the target line width, the line widths of the color 1 patterns 170, 174, and 178 and the line widths of the color 2 patterns 172 and 176 may be asymmetric. Alternatively or additionally, when the line widths of the color 2 patterns 172 and 176 are greatly decreased due to an influence of the color 1 patterns 170, 174, and 178 in a specific region, portions of the color 2 patterns 172 and 176 may be cut off, or trimmed, or malformed.

Hereinafter, a method of forming metal patterns by the double patterning process and defects in the metal patterns may be described.

FIGS. 2 to 17 are cross-sectional views and plan views illustrating a method of forming metal patterns in a semiconductor device by a double patterning process.

FIGS. 2, 4, 5, 6, 8, 10, 12, 13, 15 and 16 are cross-sectional views, and FIGS. 3, 7, 9, 11, 14 and 17 are plan views. Hereinafter, a method of forming the metal pattern shown in FIG. 1 may be described. Each of cross-sectional views is taken along line I-I' in FIG. 1.

Figure 2:
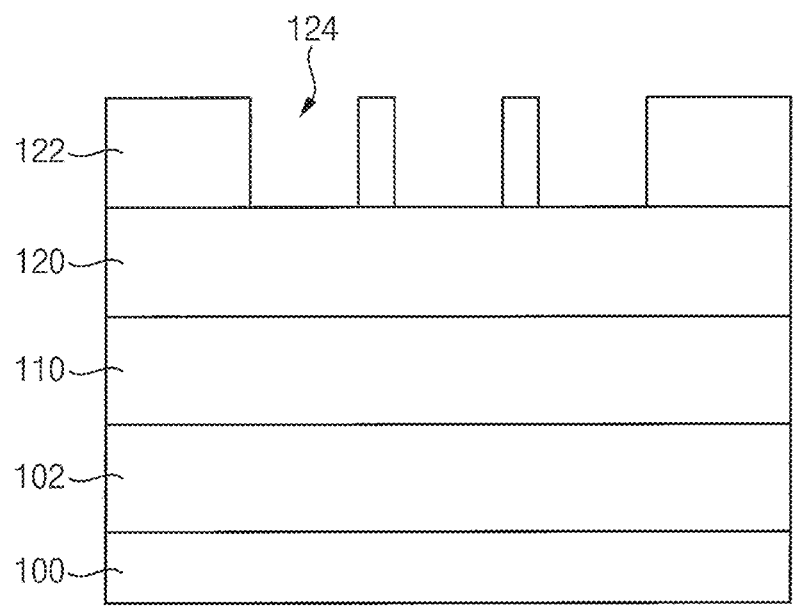
Figure 3:
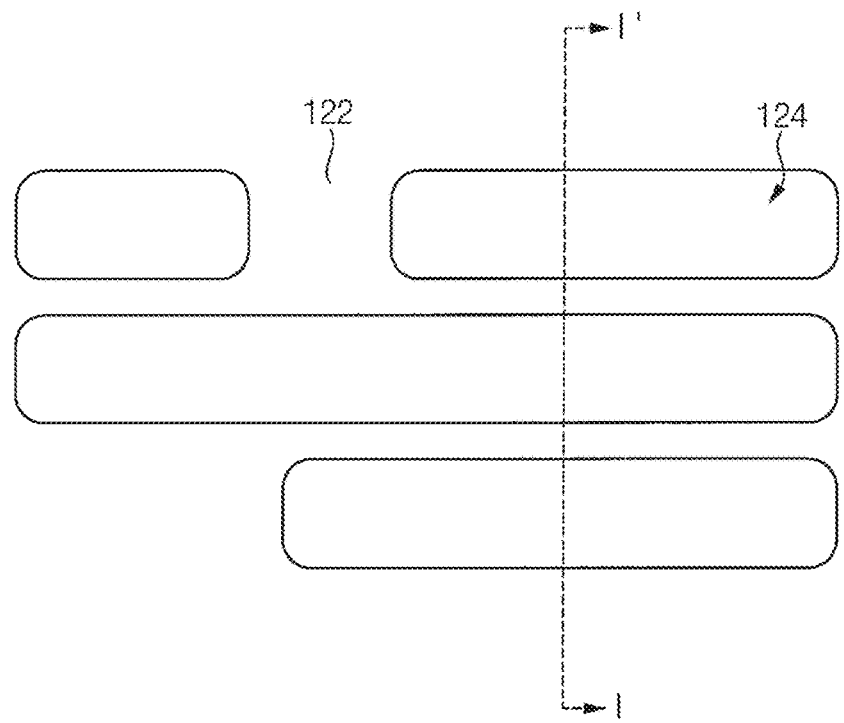

Referring to FIGS. 2 and 3, a lower structure (not shown) may be formed on the substrate 100. An insulating interlayer 102 may be formed on the lower structure. An intermetal dielectric layer 110 may be formed on the insulating interlayer 102. An etch stop layer (not shown) may be further formed between the insulating interlayer 102 and the intermetal dielectric layer 110.

A first mask layer 120 may be formed on the intermetal dielectric layer 110.

A first photoresist pattern 122 may be formed on the first mask layer 120 by a first photo process. The first photoresist pattern 122 may serve as an etching mask for forming color 1 patterns.

The first photoresist pattern 122 may include or define a first trench 124. The first trench 124 may be formed at a portion for forming the color 1 patterns and space portions from both sides of the color 1 patterns. An inner width of the first trench 124 of the first photoresist pattern 122 in the second direction may be three times the second line width W2.

Figure 4:
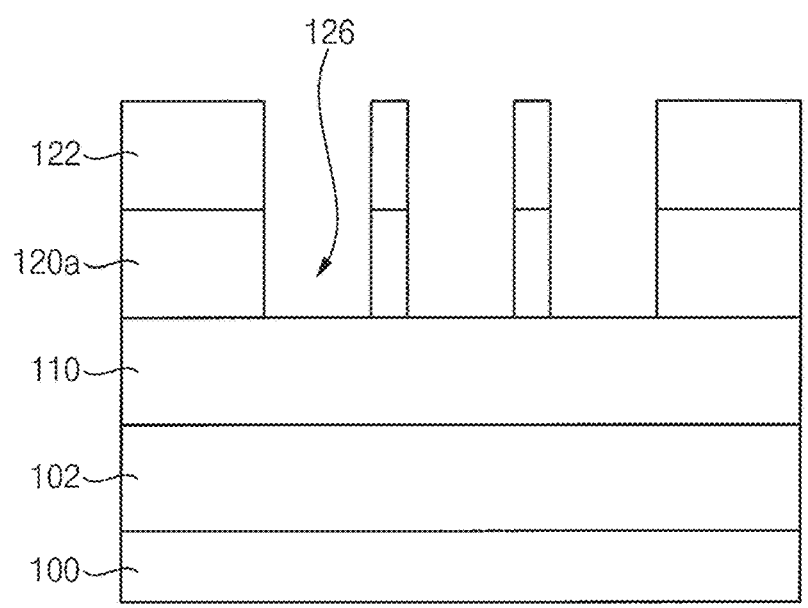

Referring to FIG. 4, the first mask layer 120 may be etched using the first photoresist pattern 122 as an etching mask to form a first mask pattern 120a. The first mask pattern 120a may include or define a second trench 126 formed at a position corresponding to the first trench 124.

Thereafter, the first photoresist pattern 122 may be removed.

Figure 5:
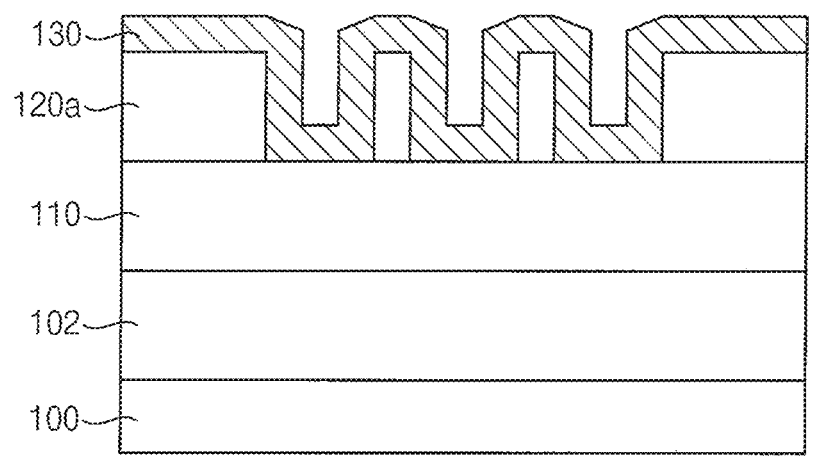

Referring to FIG. 5, a spacer layer 130 may be conformally formed on surfaces of the first mask pattern 120a and the intermetal dielectric layer 110. In various example embodiments, the spacer layer 130 may have the same thickness as the second line width W2. In various example embodiments, the spacer layer 130 may be formed by an atomic layer deposition (ALD) process.

Figure 6:
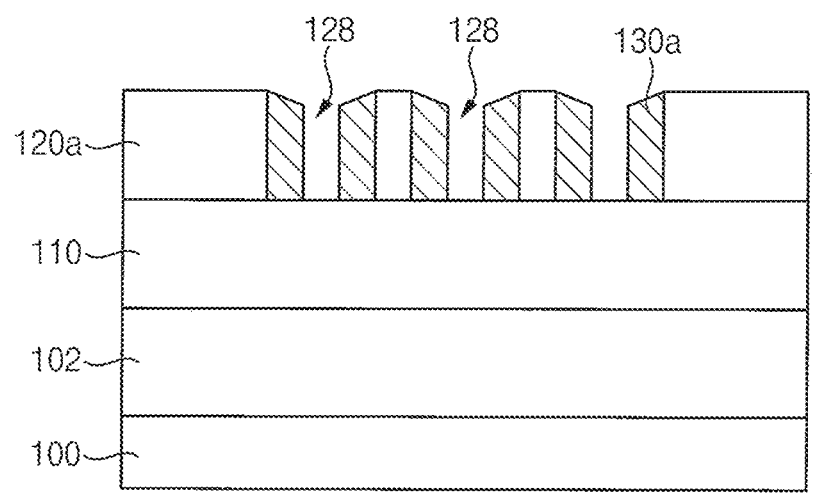
Figure 7:
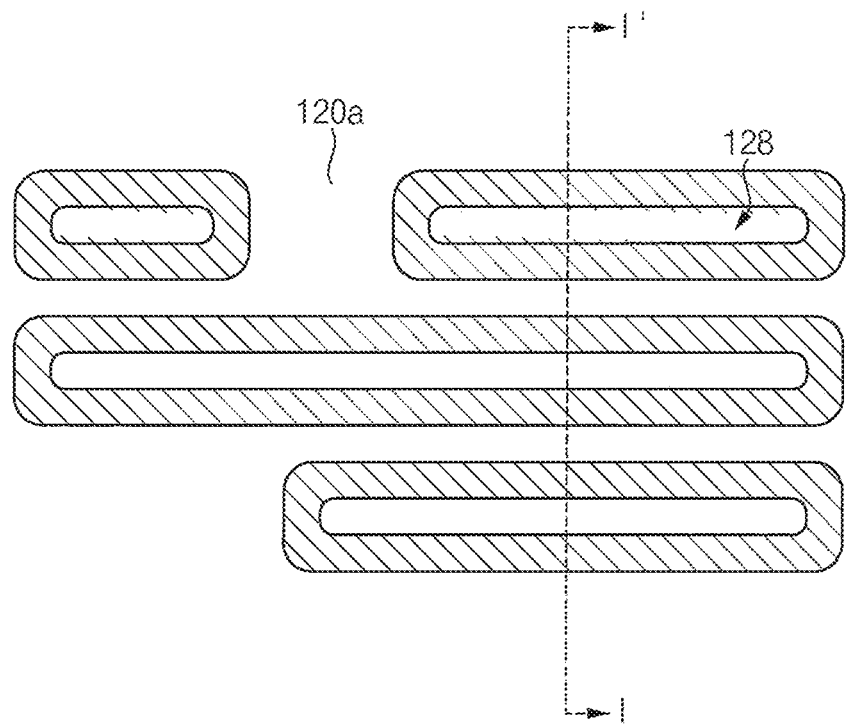

Referring to FIGS. 6 and 7, the spacer layer 130 may be anisotropically etched to form a spacer 130a on a sidewall of the first mask pattern 120a. For example, the spacer 130a may be formed on the inner sidewall of the second trench 126. A width of the spacer 130a may be the second line width W2. The spacer 130a may include a material having an etch selectivity respect to the first mask pattern 120a. The spacer 130a may serve as a mandrel for forming the color 1 patterns.

The spacer 130a may be formed on the inner sidewall of the second trench 126, so that a third trench 128 including the spacer 130a may be formed. The third trench 128 may have an inner width less than an inner width of the second trench 126. The inner width of the third trench 128 may be substantially the same as the second line width W2. The third trench 128 may serve as a region for forming each of the color 1 patterns. For example, the third trench 128 may correspond to a portion where each of the first, third, and fifth group of conductive lines (referring to FIG. 1, conductive lines 170, 174 and 178) is formed.

Figure 8:
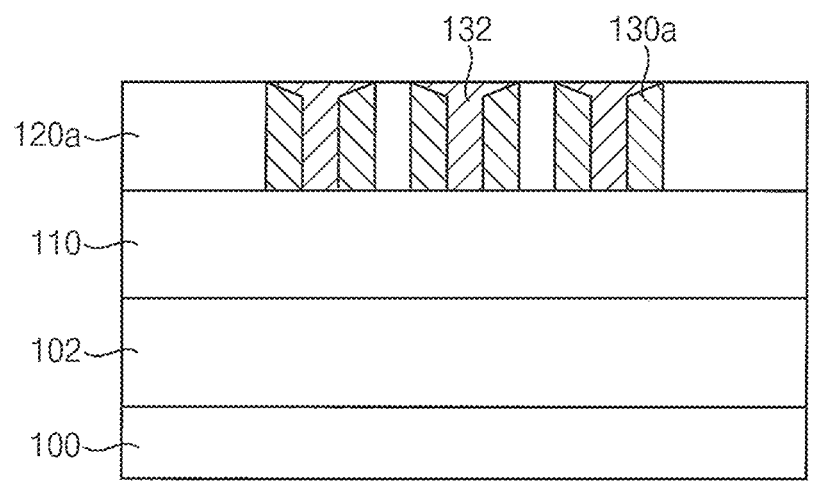
Figure 9:
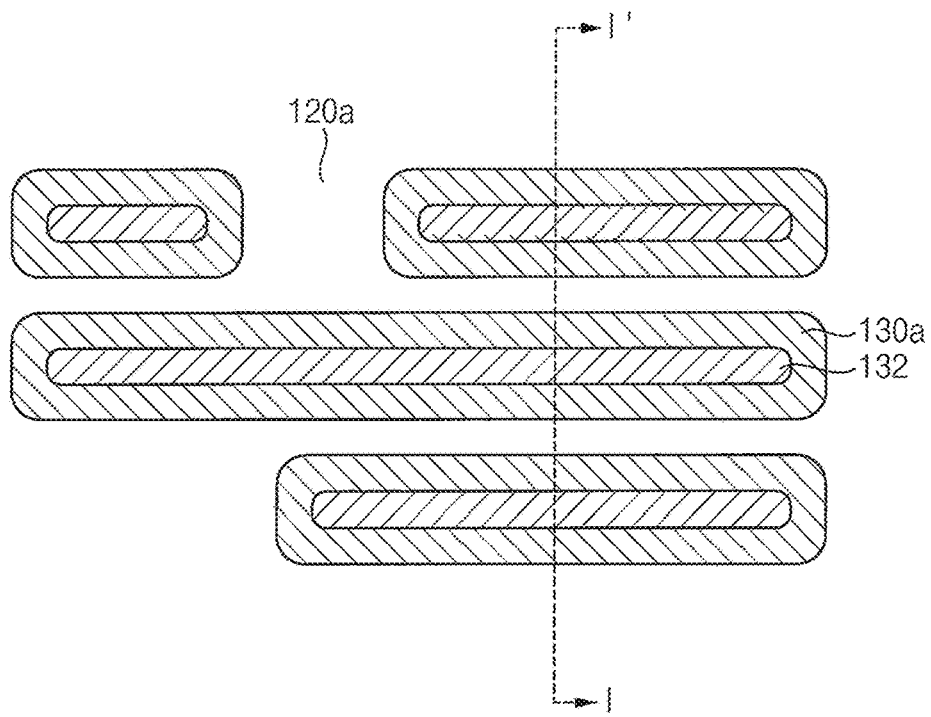

Referring to FIGS. 8 and 9, a second mask layer may be formed on the first mask pattern 120a to fill the third trench 128.

The second mask layer may be planarized until an upper surface of the first mask pattern 120a may be exposed, e.g. with a chemical mechanical planarization (CMP) process and/or with an etch-back process, to form a second mask pattern 132 in the third trench 128. In some example embodiments, the planarization process of the second mask layer may be omitted.

The second mask layer may include a material having an etch selectivity with respect to, e.g. may etch slower than, each of the first mask pattern 120a and the spacer 130a.

Figure 10:
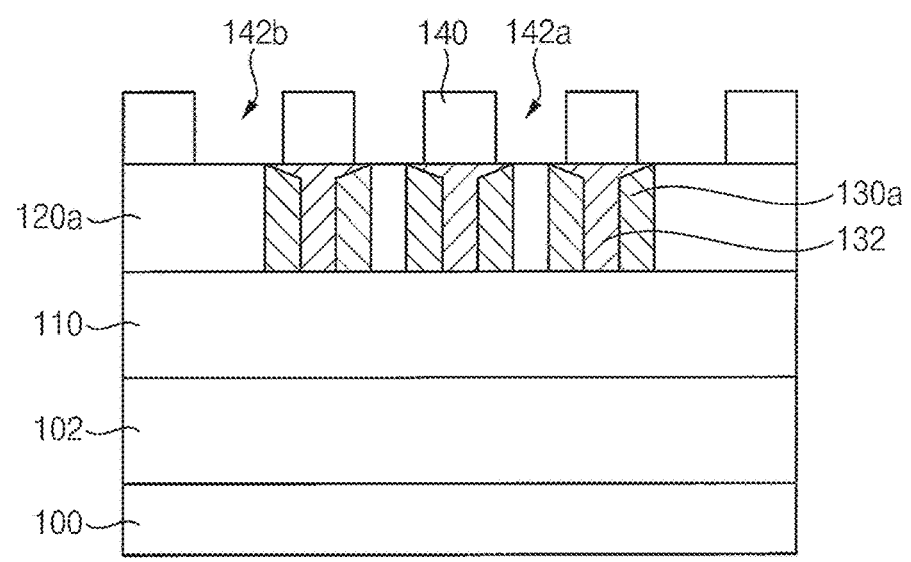
Figure 11:
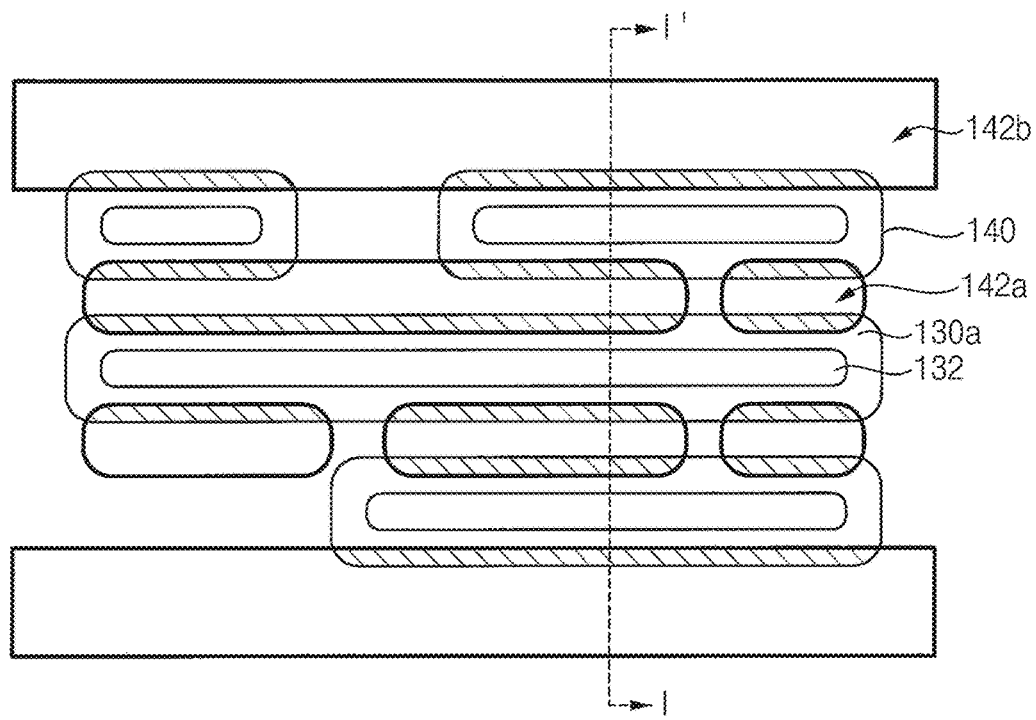

Referring to FIGS. 10 and 11, a second photoresist pattern 140 may be formed on the first mask pattern 120a, the second mask pattern 132, and the spacer 130a by a second photo process. The second photoresist pattern 140 may serve as a mask for forming color 2 patterns.

The second photoresist pattern 140 may include fourth trenches 142a and 142b in regions for forming the color 2 patterns. For example, the fourth trenches 142a and 142b may correspond to portions for forming power rails, and second and fourth group of conductive lines. The second photoresist pattern 140 may cover an upper portion of the second mask pattern 132. For example, the second photoresist pattern 140 may cover at least regions for forming the color 1 patterns.

The fourth trench 142b for forming each of the power rails may have an inner width the same as the first line width. The fourth trench 142a for forming each of the second and fourth group of conductive lines may have an inner width greater than the second line width and less than three times the second line width. At least one sidewall of the fourth trench 142a for forming each of the second and fourth group of conductive lines may be positioned on an upper surface of the spacer 130a.

In various example embodiments, both sidewalls of the fourth trench 142a for forming each of the second and fourth group of conductive lines may be positioned on the upper surface of the spacer 130a. Thus, the first mask pattern 120a between the spacers 130a may be exposed by a bottom of the fourth trench 142a.

Figure 12:
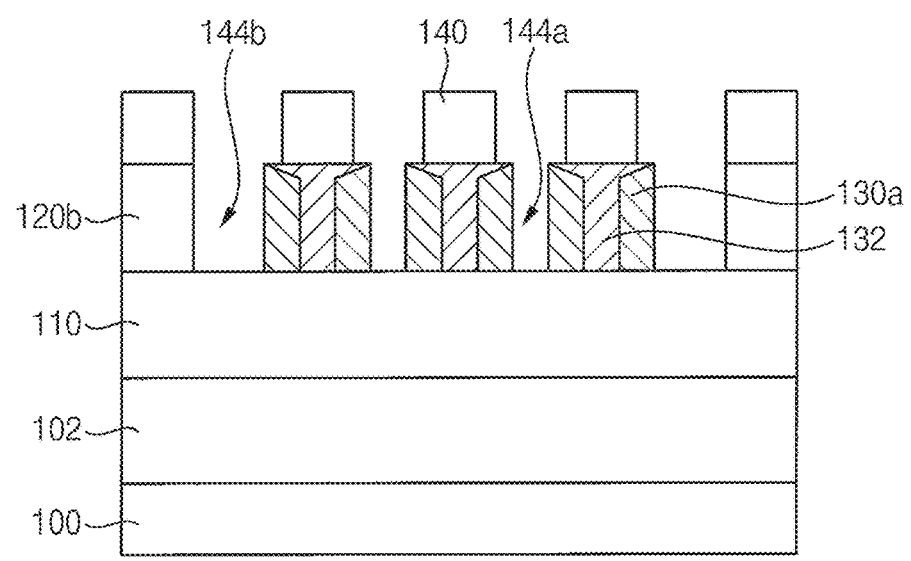

Referring to FIG. 12, the first mask pattern 120a may be etched using the second photoresist pattern 140 as an etching mask to form a third mask pattern 120b.

In the etching process, the spacer 130a may be etched by a small amount, or by a very small amount. The second mask pattern 132 may be covered by the second photoresist pattern 140, so that the second mask pattern 132 may not be etched by the etching process.

Therefore, a third mask pattern 120b, a second mask pattern 132, and a spacer 130a may be formed on the intermetal dielectric layer 110.

Fifth trenches 144a and 144b may be formed in the third mask pattern 120b. Each of the fifth trenches 144a and 144b may be positioned at the portions for forming the power rails, the second and fourth group of conductive lines.

Thereafter, the second photoresist pattern 140 may be removed.

Figure 13:
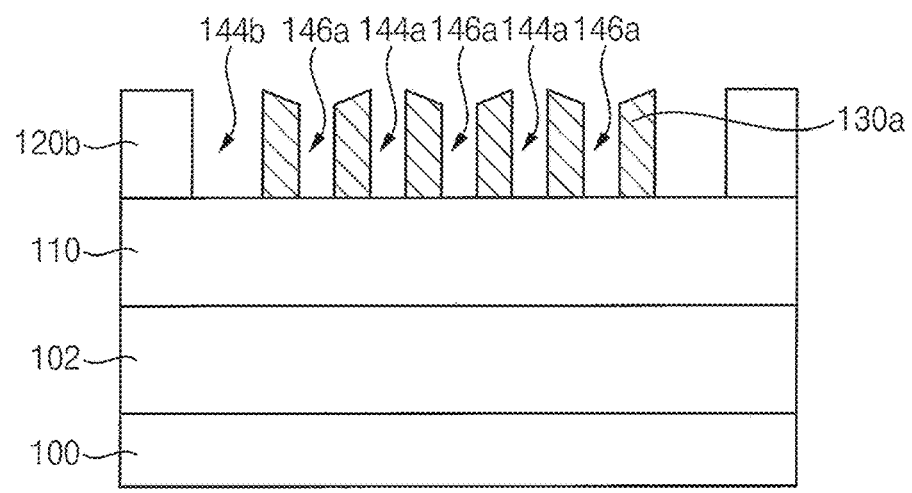
Figure 14:
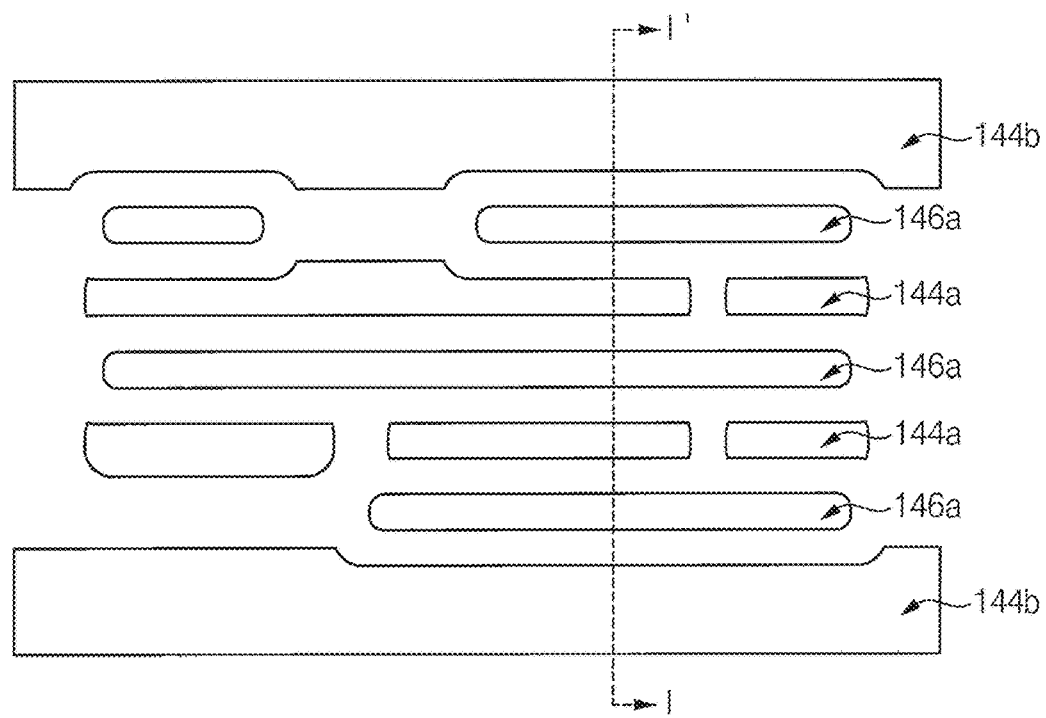

Referring to FIGS. 13 and 14, the second mask pattern 132 may be removed to form a sixth trench 146a. The sixth trench 146a may be formed at a region of removed second mask pattern 132. The first, third, and fifth group of conductive lines may be formed in the sixth trench 146a.

The fifth trench 144a for forming each of the second and fourth group of conductive lines may have an inner width the same as the second line width. The fifth trench 144b for forming each of the power rails may have an inner width the same as the first line width.

As described above, the second and fourth group of conductive lines may be formed between the spacers 130a, so that the line width of each of the color 2 patterns is determined by a width between the spacers 130a. For example, when the inner width of the second trench 126 for forming each of the color 1 patterns may be increased, the line width of each of the color 1 patterns may be increased. In addition, when the line width of each of the color 1 patterns may be greater than a target line width, the width between the spacers 130a may be decreased. Thus, the line width of each of the color 2 pattern may be less than the target line width. Conversely, when the line width of each of the color 1 patterns may be less than the target line width, the width between the spacers 130a may be increased. Thus, the line width of each of the color 2 patterns may be greater than the target line width. When the line width of each of the color 2 patterns decreases, portions of the color 2 patterns may be cut off.

In an actual process, the line width of each of the color 1 patterns and the line width of each of the color 2 patterns may not be completely identical. Therefore, the line width of each of the color 1 patterns and the line width of each of the color 2 patterns may be asymmetric with respect to each other.

Figure 15:
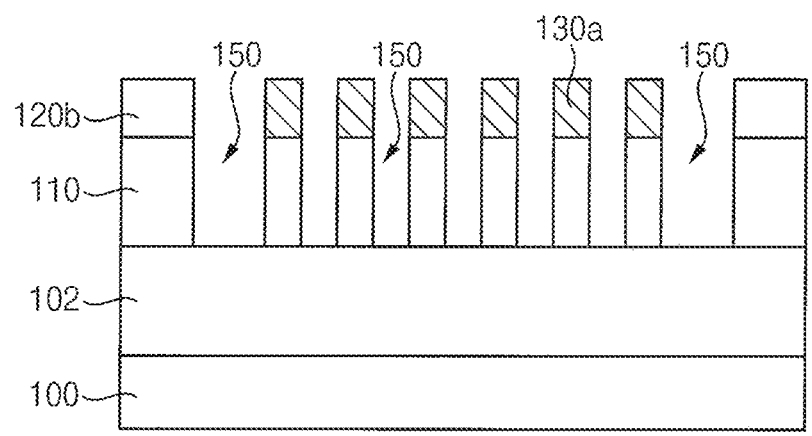

Referring to FIG. 15, the intermetal dielectric layer 110 may be etched using the third mask pattern 120b and the spacer 130a as an etch mask to form seventh trenches 150 in the intermetal dielectric layer 110. In the etching process, the third mask pattern 120b and the spacer 130a may also be partially etched so that thicknesses of the third mask pattern 120b and the spacer 130a may be decreased.

The seventh trenches 150 may be formed at regions for forming the power rails and conductive lines at the first row to fifth row, respectively.

Figure 16:
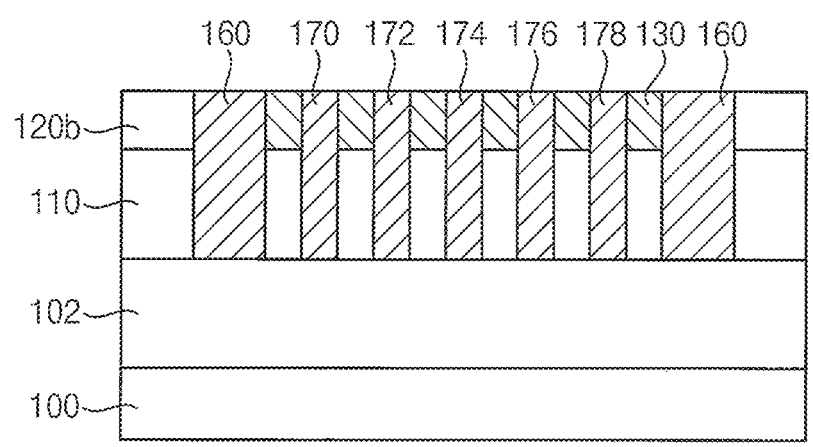
Figure 17:
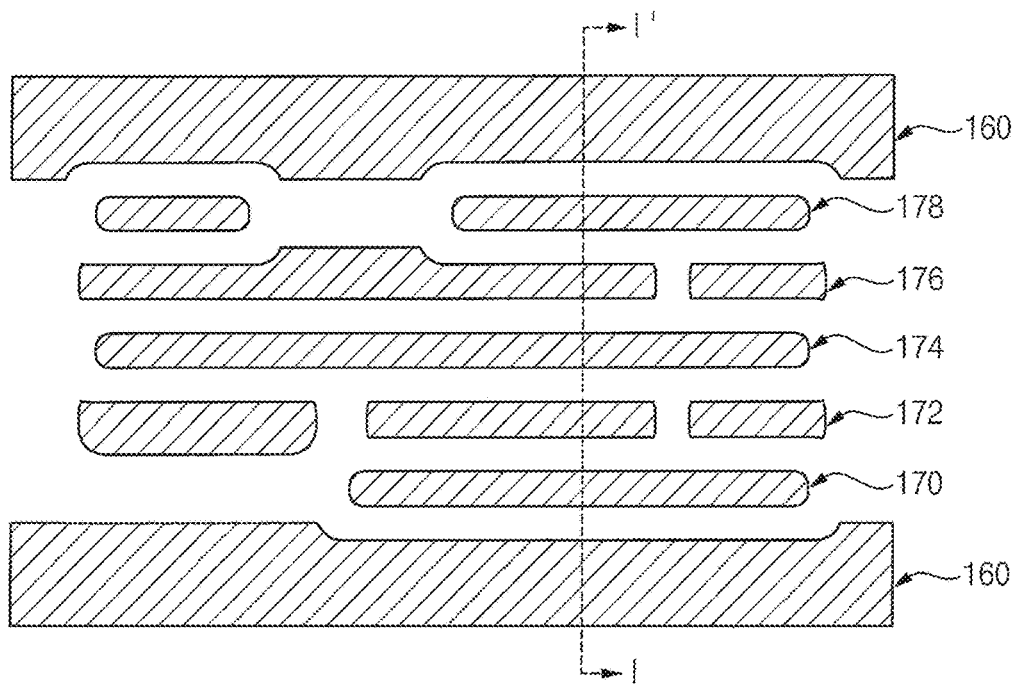

Referring to FIGS. 16 and 17, a metal layer may be formed on the third mask pattern 120b and the spacer 130a to fill the seventh trench 150. The metal layer may be planarized until an upper surface of the intermetal dielectric layer 110 may be exposed to form metal patterns 160, 170, 172, 174, 176 and 178. The metal patterns 160, 170, 172, 174, 176 and 178 may include the power rails 160 and first to fifth group of conductive lines 170, 172, 174, 176 and 178.

In the metal patterns formed by the above process, a line width defect in which each of line widths may be out of a range of an allowable line width may occur. Therefore, after forming the metal patterns, a monitoring process for checking of the line width defects in the metal patterns may be required or desired. However, it may be difficult to directly perform the monitoring process on actual metal patterns connected to an actual logic circuit. Therefore, a chip of the logic circuit device may include macro patterns that are suitable patterns for monitoring of the metal patterns.

Hereinafter, the macro patterns suitable for monitoring of the metal patterns may be described.

Referring to FIGS. 18 to 22 are plan views illustrating macro patterns for monitoring of a line width of a pattern in accordance with various example embodiments.

FIGS. 18 to 22 illustrate first to fifth types of macro patterns, respectively.

The macro patterns may be used for monitoring of line width defects caused by asymmetric between the line width of the color 1 pattern and the line width of the color 2 pattern in the conductive line region between the power rails. Further, the line width defects in the logic circuit device may be prevented, or reduced in likelihood of occurrence and/or of impact from occurrence, by the monitoring of line width defects. Therefore, the macro patterns may include at least one color 1 pattern and color 2 pattern adjacent to the color 1 pattern in the conductive line region.

Each of the macro patterns may be disposed in a unit standard cell region S. The macro patterns for monitoring of the line width defect of the color 1 pattern and the color 2 pattern may have a number of combinations, e.g. five combinations. For example, the macro patterns may include a first type of macro pattern to a fifth type of macro pattern. The first type to the fifth type of macro patterns may be spaced apart from each other and arranged in one direction. In the first to fifth types of macro patterns, an arrangement of conductive lines in the unit standard cell region S may be different from each other.

Referring to FIGS. 18 to 22, each of types of macro patterns may include two power rails 210 extending in the first direction. The power rails 210 may be spaced apart from each other in the second direction, and may be disposed to face each other. A region between the two power rails 210 disposed to face each other in the second direction may be the conductive line region for forming the conductive lines.

Five rows C1 to C5 extending in the first direction and spaced apart from each other in the second direction may be included in the conductive line region. First to fifth rows arranged from a bottom to a top may be included in the conductive line region. One conductive line may be selectively disposed at each of the rows. The conductive lines formed at the first to fifth rows may be referred to as first to fifth conductive lines 220, 222, 224, 226 and 228, respectively. For example, the conductive line formed at the first row may be referred to as a first conductive line 220, and the conductive line formed at the fifth row may be referred to as a fifth conductive line 228. The first, third, and fifth conductive lines 220, 224 and 228 formed at odd rows may be or may correspond to or may be referred to as the color 1 patterns. The second and fourth conductive lines 222 and 226 formed at even rows may be or may correspond to or may be referred to as the color 2 patterns.

In each of types of macro patterns, the power rail 210 may have a first length L1 in a first direction. The first length L1 may be the same as a length of the unit standard cell region S in the first direction. The power rail 210 may have the first line width.

In each of types of macro patterns, each of the conductive lines 220, 222, 224, 226 and 228 may have the second line width. Also, the conductive lines 220, 222, 224, 226 and 228 adjacent to each other in the second direction may be spaced apart from each other by the same distance as the second line width in the second direction. For example, each of the conductive lines 220, 222, 224, 226, and 228 may have the second line width the same as a minimum line width of metal patterns in the logic circuit device. Alternatively or additionally, each of the conductive lines 220, 222, 224, 226, and 228 may be disposed to have space the same as a minimum space between the metal patterns in the logic circuit device.

Figure 18:
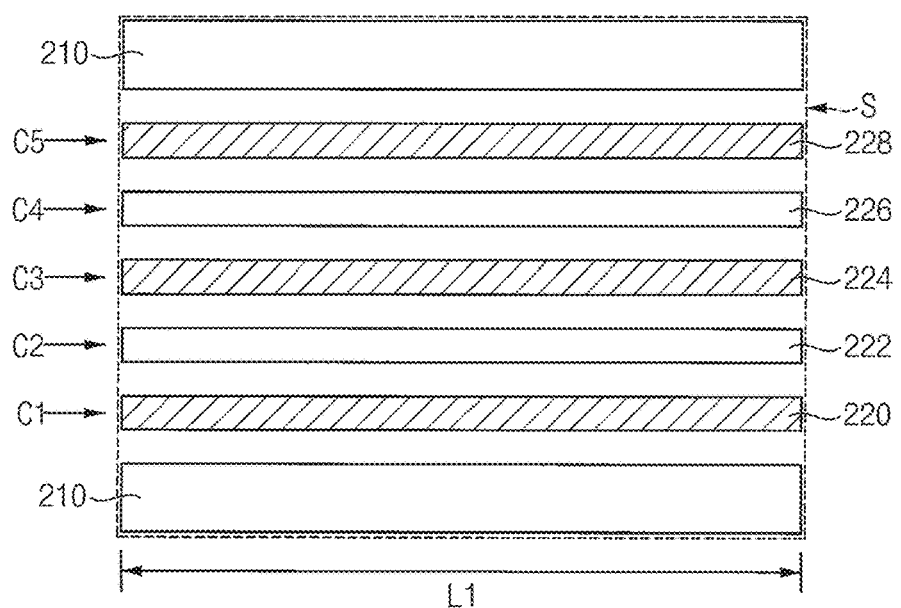

Referring to FIG. 18, a first type of macro pattern 200a may be a pattern in which conductive lines are disposed at all of the first to fifth rows C1 to C5. The first type of macro pattern 200a may be referred to as a dense pattern. For example, the first type of macro pattern 200a may include first to fifth conductive lines 220, 222, 224, 226 and 228. In the first type of macro pattern 200a, the first to fifth conductive lines 220, 222, 224, 226, and 228 may have the first length in a first direction. In the first type of macro pattern 200a, the power rail 210 and the first to fifth conductive lines 220, 222, 224, 226 and 228 may have the same length in the first direction.

The first type of macro pattern 200a may represent the metal patterns of the logic circuit device in which the color 1 pattern and the color 2 pattern are alternately and repeatedly disposed to be spaced apart from each other in the second direction by the same distance as the second line width.

When defects in the line widths of the first to fifth conductive lines 220, 222, 224, 226, and 228 in the first type of macro pattern 200a occur, the metal pattern having similar arrangement in the logic circuit device may be also determined as or suspected as being defective. Thus, the defects in the line width of the metal patterns in the logic circuit device may be detected by the monitoring of the line widths of the first to fifth conductive lines 220, 222, 224, 226 and 228 in the first type of macro pattern 200a. When the color 1 pattern and the color 2 pattern are densely and repeatedly arranged, the defect in the line width may be detected or suspected by the first type of macro pattern 200a.

Figure 19:
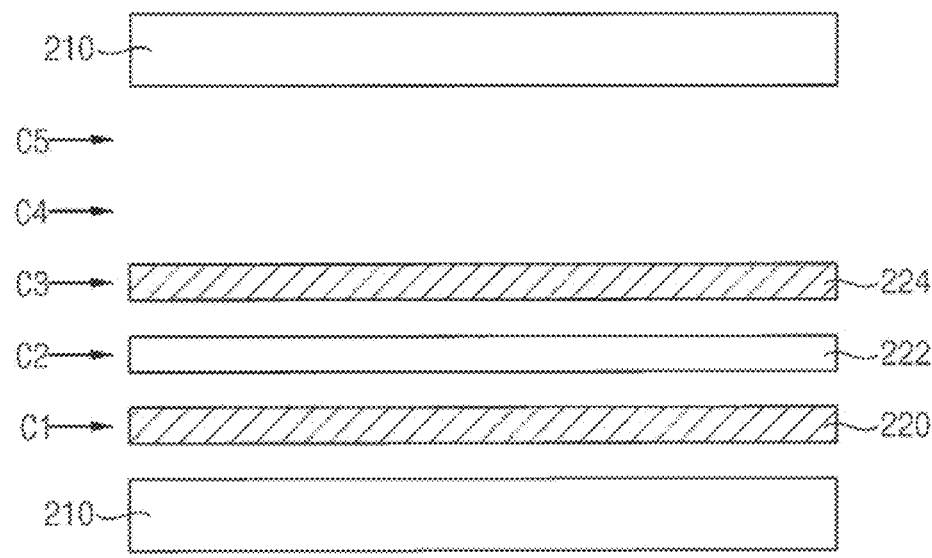

Referring to FIG. 19, the second type of macro pattern 200b may include three conductive lines. The second type of macro pattern 200b may include conductive lines disposed at two rows among odd rows C1, C3, and C5 and a conductive line disposed at one row among the even rows C2 and C4. The three conductive lines included in the second type of macro pattern 200b may be spaced apart from each other in the second direction by the same distance as the second line width. For example, the three conductive lines included in the second type of macro pattern 200b may be adjacent to each other in the second direction. Each of the conductive lines included in the second type of macro pattern 200b may have the first length.

In various example embodiments, the second type of macro pattern 200b may include first to third conductive lines 220, 222, and 224. In some example embodiments, although not illustrated, the second type of macro pattern may include third to fifth conductive lines 224, 226 and 228. For example, the second type of macro pattern including third to fifth conductive lines 224, 226 and 228 may have an inverted shape form the second type of macro pattern shown in FIG. 19, and may have an arrangement substantially the same as an arrangement of the second type of macro pattern shown in FIG. 19. Therefore, the second type of macro pattern including the third to fifth conductive lines 224, 226, and 228, and the second type of macro pattern including the first to third conductive lines 220, 222, 224 may be recognized as the same type of macro pattern.

The second type of macro pattern 200b may include the conductive lines disposed at only some rows. Thus, the second type of macro pattern 200b may be referred to as a semi-dense pattern.

The second type of macro pattern 200b may represent the metal patterns of the logic circuit device in which two color 1 patterns and one color 2 pattern are spaced apart from each other in the second direction by the same distance as the second line width and are adjacent to each other. When defects in the line widths of the first to third conductive lines 220, 222 and 224 in the second type of macro pattern 200b occur, the metal patterns having a similar arrangement in the logic circuit device may be also determined or suspected as being defective. Thus, the defect of the line width of the metal patterns in the logic circuit device may be detected by the monitoring of the line widths in the first to third conductive lines 220, 222 and 224 in the second type of macro pattern. When two color 1 patterns and the color 2 pattern therebetween are disposed, the defect in the line width may be detected by the second type of macro pattern 200b.

Figure 20:
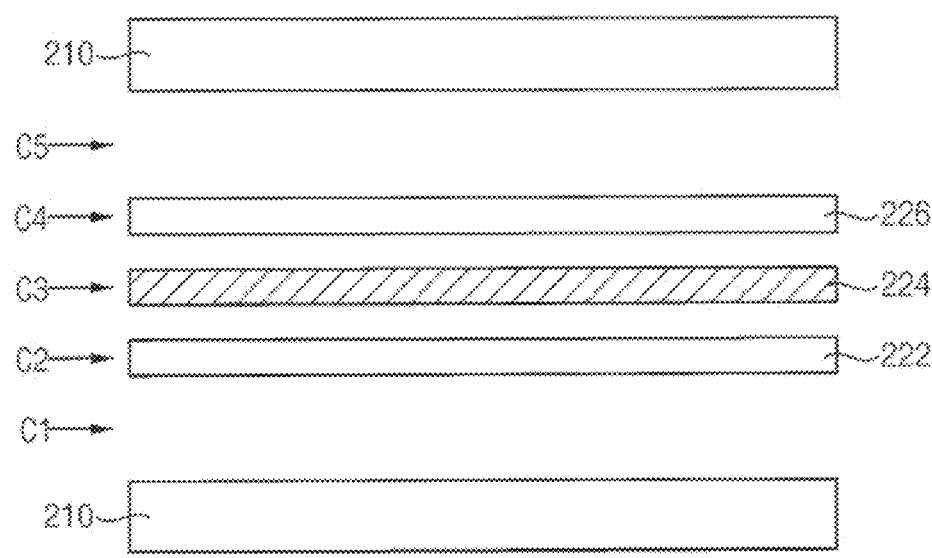

Referring to FIG. 20, the third type of macro pattern 200c may include three conductive lines. The third type of macro pattern 200c may include a conductive line disposed at one row among the odd rows C1, C3, and C5 and conductive lines disposed at two row among the even rows C2 and C4. The three conductive lines included in the third type of macro pattern 200c may be spaced apart from each other in the second direction by the same distance as the second line width. For example, the three conductive lines included in the third type of macro pattern 200c may be disposed adjacent to each other in the second direction. Each of the conductive lines included in the third type of macro pattern 200c may have the first length. In various example embodiments, the third type of macro pattern 200c may include second to fourth conductive lines 222, 224 and 226. The third type of the macro pattern 200b may include the conductive lines disposed at only some rows. Thus, the third type of the macro pattern 200b may be referred to as the semi-dense pattern.

The third type of macro pattern 200c may represent the metal patterns of the logic circuit device in which one color 1 pattern and two color 2 patterns are spaced apart from each other in the second direction by the same distance as the second line width and are disposed adjacent to each other. When defects in the line widths of the second to fourth conductive lines 222, 224 and 226 in the third type of macro pattern 200c occur, the metal patterns having a similar arrangement of the logic circuit device may be also determined or suspected as defective. Thus, a defect of the line width of the metal patterns in the logic circuit device may be detected by the monitoring of the line widths of the second to fourth conductive lines 222, 224 and 226 in the third type of macro pattern 200c. When one color 1 pattern and two color 2 patterns adjacent to both sides of the color 1 pattern are disposed, the defect of the line width may be detected by the third type of macro pattern 200c.

Each of the conductive lines included in the first to third type of macro patterns 200a, 200b, and 200c may have the first length. Each of the conductive lines 220, 222, 224, 226, 228 and the power rails 210 included in the first to third type of macro patterns 200a, 200b and 200c have the same length, and may be arranged parallel to each other. Therefore, the first to third types of macro patterns 200a, 200b, and 200c may be classified as a first length type. The macro patterns 200a, 200b, and 200c of the first length type may include three conductive lines or five conductive lines.

Defects in the line widths of metal patterns according to the number and arrangement of color 1 pattern and color 2 pattern may be detected by monitoring of the line widths of the color 1 pattern and the color 2 pattern included in the first to third types of macro patterns 200a, 200b, and 200c.

Figure 21:
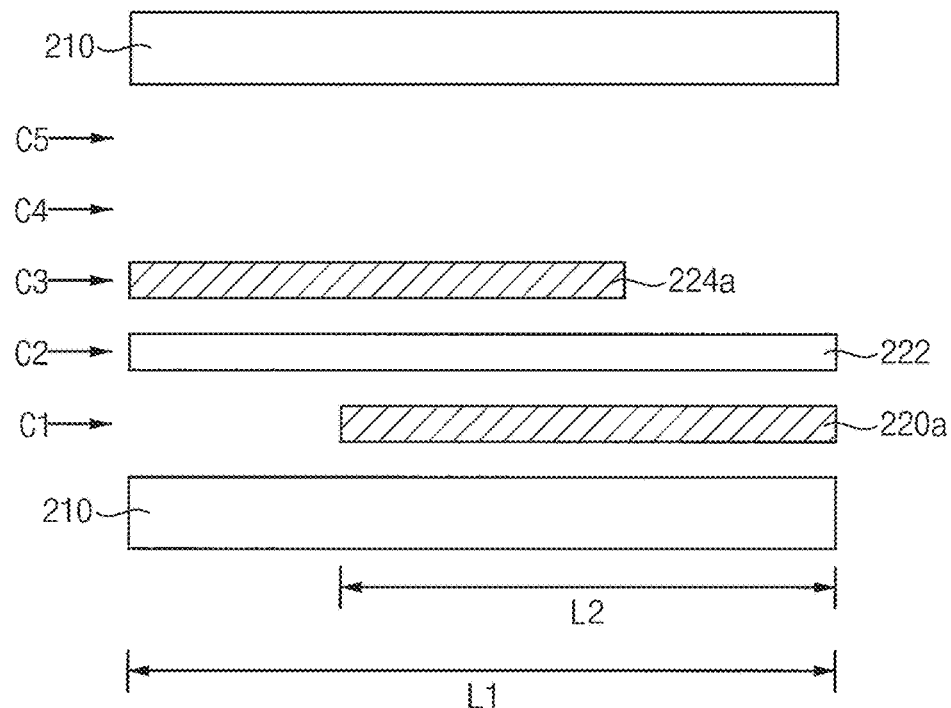

Referring to FIG. 21, the fourth type of macro pattern 200d may include three conductive lines. The fourth type of macro pattern 200d may include conductive lines disposed at two rows among the odd rows C1, C3 and C5 and conductive lines disposed at one row among the even rows C2 and C4. The three conductive lines included in the fourth type of macro pattern 200d may be spaced apart from each other in the second direction by the same distance as the second line width. The three conductive lines included in the fourth type of macro pattern 200d may be disposed adjacent to each other in the second direction.

In the fourth type of macro pattern 200d, one conductive line disposed at the even row may have the first length L1. In the fourth type of macro pattern 200d, two conductive lines disposed at the odd rows may have a second length L2 less than the first length L1. One end of each of the two conductive lines disposed at the odd row may be positioned at an inner portion of in the unit standard cell region. In each of conductive lines disposed at the odd row, the one ends of the conductive lines positioned at the inner portion of the unit standard cell region. The one ends of the conductive lines at the odd row may not be aligned in a line in the second direction. At least portion of the conductive lines at the odd row may be disposed to overlap to each other in the second direction.

In various example embodiments, the fourth type of macro pattern 200d may include first to third conductive lines 220a, 222 and 224a. In this case, the second conductive line 222 may have the first length. The first conductive line 220a and the third conductive lines 224a may have the second length.

Both ends in the first direction of the first conductive line 220a may be referred to as a first end and a second end. The first end of the first conductive line 220a may be positioned at a right edge of the unit standard cell region. Both ends in the first direction of the third conductive line 224*a* may be referred to as a first end and a second end. The first end of third conductive line 224*a* may be positioned at a left edge of the unit standard cell region. The second end of the first conductive line 220*a* and the second end of the third conductive line 224*a* may not be aligned to each other in the second direction. Portions of the first and the third conductive lines 220*a* and 220*c* between the second ends may be overlapped to each other in the second direction.

The second conductive line 222 may include a portion facing the first conductive line 220*a* and a portion not facing the first conductive line 220*a*. The second conductive line 222 may include a portion facing the third conductive line 224*a* and a portion not facing the third conductive line 224*a*.

In a region where the first and third conductive lines overlapped, the first to third conductive lines 220*a*, 222, 224*a* may be spaced apart from each other by the second line width in the second direction. Further, in a region where the first and third conductive lines do not overlap, the first and second conductive lines 220*a* and 222 may be spaced apart from each other by the second line width in the second directions, or the second and third conductive lines 222 and 224*a* may be spaced apart from each other by the second line width in the second direction.

The fourth type of macro pattern 200*d* may represent the metal patterns in the logic circuit device in which ends of the color 1 patterns adjacent to both sides of the color 2 pattern may not be aligned with each other. When defects in the line widths of the first to third conductive lines 220*a*, 222, 224*a* in the fourth type of macro pattern 200*d* occur, the metal patterns of the logic circuit device having a similar arrangement may be also determined as a defect. For example, the fourth type of macro pattern 200*d* may be used to monitor the line width of the color 2 pattern according to an influence of the line widths of the ends of the color 1 patterns.

Figure 22:
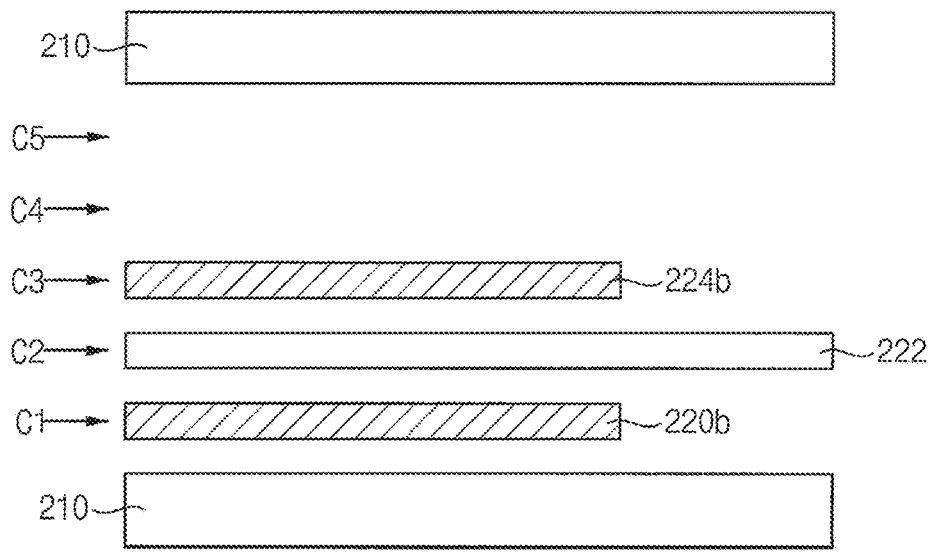

Referring to FIG. 22, the fifth type of macro pattern 200*e* may include three conductive lines. The fifth type of macro pattern 200*e* may include conductive lines disposed at two rows among the odd rows C1, C3, and C5 and a conductive line at one row among the even rows C2 and C4. The three conductive lines included in the fifth type of macro pattern 200*e* may be spaced apart from each other in the second direction by the same distance as the second line width. For example, the three conductive lines included in the fifth type of macro pattern 200*e* may be adjacent to each other in the second direction.

In the fifth type of macro pattern 200*e*, the conductive line disposed at the even row may have the first length. In the fifth type of macro pattern 200*e*, two conductive lines disposed at the odd rows may have the second length less than the first length. One end of each of the conductive lines disposed at the odd row may be positioned at an inner portion of the unit standard cell region. In each of the conductive lines disposed at the odd row, the one ends of the conductive lines positioned at the inner portion of the unit standard cell region may be aligned in the second direction. For example, the conductive lines disposed at the odd row may have the same length, and both ends of the conductive lines may be disposed to be aligned in the second direction.

In various example embodiments, the fifth type of macro pattern 200*e* may include first to third conductive lines 220*b*, 222, and 224*b*. In this case, the second conductive line 222 may have the first length. The first conductive line 220*b* and the third conductive line 224*b* may have the second length.

Both ends in the first direction of the first conductive line 220*b* may be referred to as a first end and a second end. The first end of the first conductive line 220*b* may be positioned at the left edge of the unit standard cell region. Both ends in the first direction of the third conductive line 224*b* may be referred to as a first end and a second end. The first end of the third conductive line 224*b* may be positioned at the left edge of the unit standard cell region. The first end of the first conductive line 220*b* and the first end of the third conductive line 224*b* may be aligned in the second direction. The second end of the first conductive line 220*b* and the second end of the third conductive line 224*b* may be disposed at the inner portion of the unit standard cell region. The second end of the first conductive line 220*b* and the second end of the third conductive line 224*b* may be aligned in the second direction.

The second conductive line 222 may include a portion facing the first and third conductive lines 220*b* and 224*b* and a portion not facing the first and third conductive lines 220*b* and 224*b*.

In a portion where the first to third conductive lines 220*b*, 222, and 224*b* face each other, the first to third conductive lines 220*b*, 222, 224*b* may be spaced apart from each other in the second direction by the second line width.

The fifth type of macro pattern 200*e* may represent metal patterns of the logic circuit device in which the ends of the color 1 patterns adjacent to both sides of the color 2 pattern may be aligned to each other in the second direction. When defects in the line widths of the first to third conductive lines 220*b*, 222, 224*b* in the fifth type of macro pattern 200*e* occur, the metal patterns in the logic circuit device having a similar arrangement may be also determined as or suspected as defective.

Thus, a defect of the line width of the metal patterns in the logic circuit device may be detected by the monitoring of the line widths of the first to third conductive lines 220*b*, 222 and 224*b* in the fifth type of macro pattern 200*e*. For example, the fifth type of macro pattern 200*e* may be used to monitor the line width of the color 2 pattern according to an influence of the line widths of the ends of the color 1 pattern.

Color 1 patterns included in the fourth type of macro pattern 200*d* and the fifth type of macro pattern 200*e* may have the second length. As the color 1 patterns included in the fourth and fifth types of macro patterns 200*d* and 200*e* have a length less than a length of the unit standard cell region, the fourth and fifth types of macro patterns 200*d* and 200*e* may be classified as a second length type. The macro patterns 200*d* and 200*e* of the second length type may include three conductive lines.

By monitoring the line width of the color 1 pattern and the line width of the color 2 pattern included in the fourth and fifth types of macro patterns 200*d* and 200*e*, defects of the line widths of the metal patterns according to positions of the ends of the color 1 patterns may be detected.

The first to fifth types of macro patterns 200*a*, 200*b*, 200*c*, 200*d* and 200*e* may serve as representative patterns for monitoring of defects of the line widths due to asymmetry of the line widths of the color 1 pattern and the line width of the color 2 pattern.

In various example embodiments, the first to fifth types of macro patterns may be used in monitoring of the line widths of various patterns in a semiconductor device. For example, the first to fifth types of macro patterns may be provided for monitoring of a line width of each of patterns included in a multi-bridge channel transistor.

Figure 23:
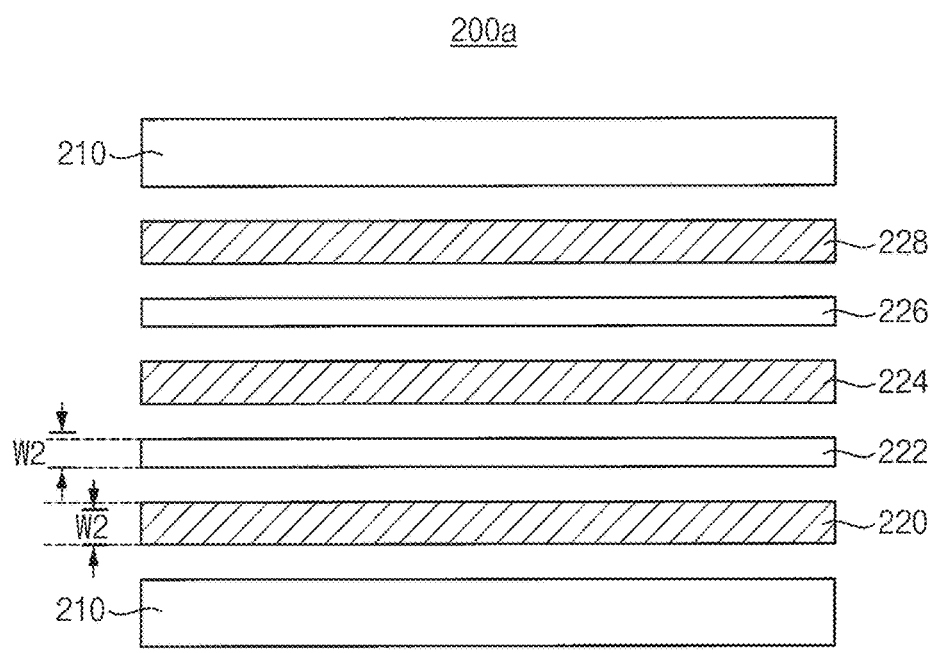
Figure 24:
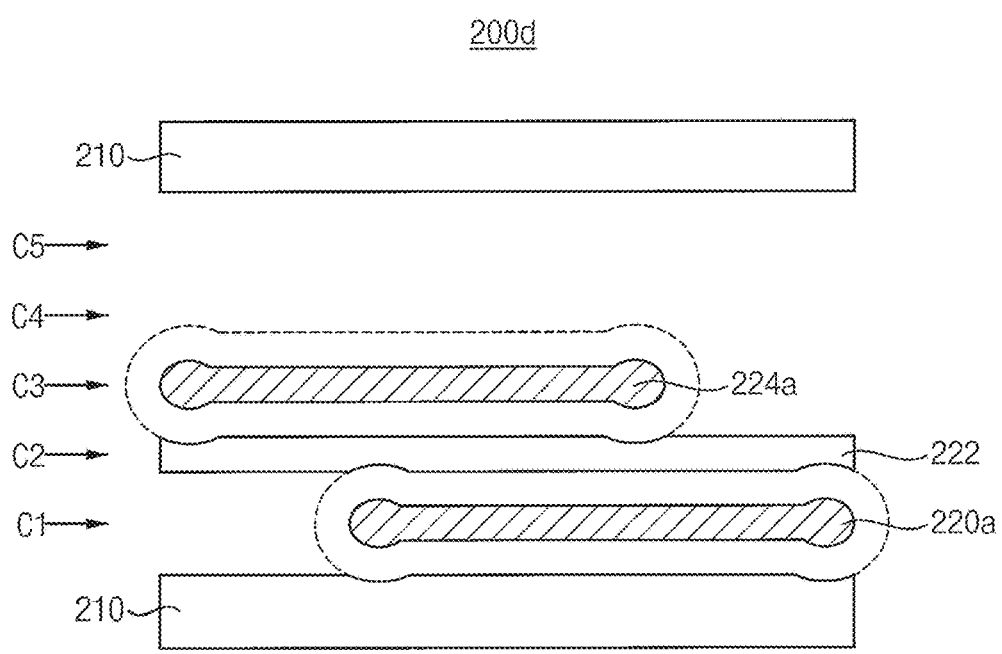
Figure 25:
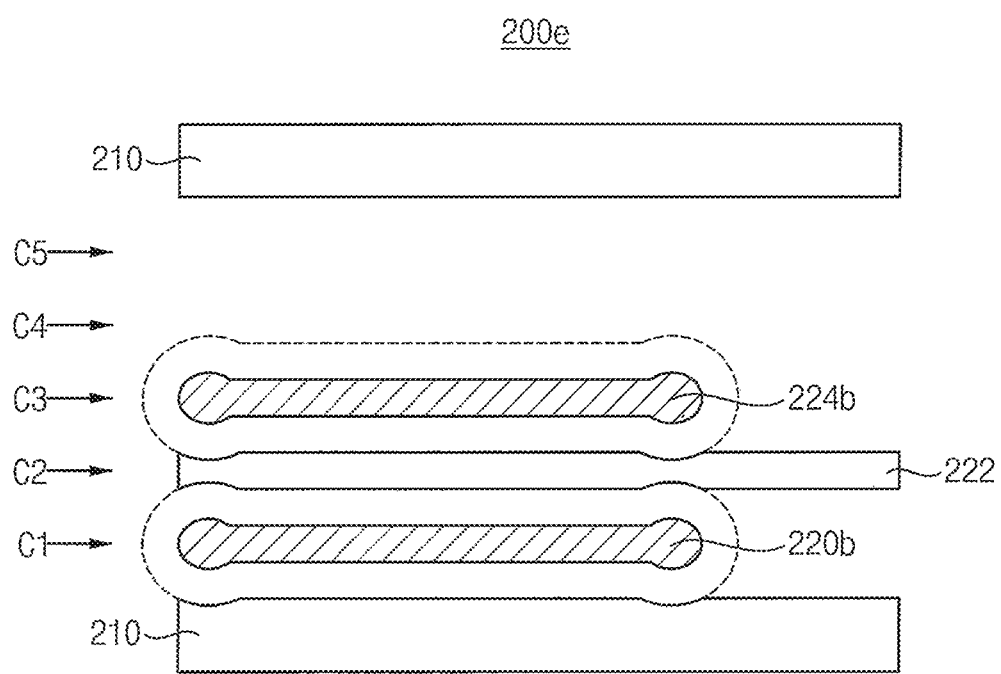

FIGS. 23 to 25 are plan views illustrating defects occurring in each type of macro pattern for monitoring of line widths of patterns in accordance with various example embodiments.

FIG. 23 illustrates defects occurring in the first type of macro pattern.

Referring to FIG. 23, in manufacturing processes of the logic circuit device, defects in which the line width of the color 1 pattern are greater than a target line width (i.e., second line width) may occur.

In this case, in the first type of macro pattern 200a, each of the first, third, and fifth conductive lines 220, 224 and 228, which are color 1 patterns, may have a line width greater than the second line width. Also, in the first type of macro pattern 200a, each of the second and fourth conductive lines 222 and 226, which are the color 2 patterns, may have a line width less than the second line width.

In the first type of macro pattern 200a, the line width of each of the first to fifth conductive lines 220, 222, 224, 226, and 228 may be measured. When the line width of each of the first to fifth conductive lines 220, 222, 224, 226 and 228 is out of a range of an allowable line width, the conductive line may be determined as a defect.

In addition, in the second type of macro pattern 200b, each of the first and third conductive lines 220 and 224, which are color 1 patterns, may have a line width greater than a target line width (i.e., second line width). In this case, in the second type of macro pattern 200b, the second conductive line 222, which may be a color 2 pattern, may have a line width less than the second line width.

In the second type of macro pattern 200b, the line width of each of the first to third conductive lines 220, 222, and 224 may be measured. When the line width of each of the first to third conductive lines 220, 222 and 224 is out of a range of an allowable line width, the conductive line may be determined as a defect.

When the color 2 pattern is formed at both sides of one color 1 pattern, line widths of the patterns may be confirmed by the third type of macro pattern 200c. In the third type of macro pattern 200c, the color 1 pattern may be adjacent to one side of the color 2 pattern, and thus the color 2 pattern may not be between the color 1 patterns. Therefore, the line width of the color 2 pattern may be slightly greater than the second line width by difference of pattern density.

The line width of each of the second to fourth conductive lines 222, 224 and 226 may be measured, for example with a scanning electron microscope (SEM) tool. When the line width of each of the second to fourth conductive lines 222, 224 and 226 is out of a range of an allowable line width, the conductive line may be determined as defective.

As the line widths of the conductive lines included in the first to third type of macro patterns 200a, 200b, and 200c is measured, a defect in the line width of the metal patterns in the logic circuit device may be detected.

FIG. 24 illustrates defects occurring in the fourth type of macro pattern.

Referring to FIG. 24, in manufacturing processes of the logic circuit device, defects in which the line width of the second end of the color 1 pattern may be greater than a target line width (i.e., second line width) may occur.

In this case, in the fourth type of macro pattern 200d, the second end of each of the first and third conductive lines 220a, 222, 224a, which are the color 1 patterns, may have a line width greater than the second line width. Also, in the fourth type of macro pattern 200d, a portion of the second conductive line 222 facing the second end of the first conductive line 220a may have a line width less than the second line width locally.

When the line width of the second end of the first conductive line 220a excessively increases, the portion of the second conductive line 222 facing the second end of the first conductive line 220a may be cut off.

In addition, the portion of the second conductive line 222 facing the second end of the third conductive line 224a may have a line width less than the second line width locally. When the line width of the second end of the third conductive line 224a excessively increases, the portion of the second conductive line 222 facing the second end of the third conductive line 224a may be cut off. Thus, a resistance of the second conductive line 222 may be increased and/or the second conductive line 222 may be disconnected.

In the fourth type of macro pattern 200d, the line width of each of the first to third conductive lines 220a and 224a may be measured. In this case, the line width of the second conductive line 222 may be measured at portions facing the first seconds of the first and third conductive lines 220a and 224a. When the line width of each of the first to third conductive lines 220a, 222 and 224a is out of a range of an allowable line width, the conductive line may be determined as defective.

As the line widths of the conductive lines included in the fourth type of macro pattern 200d is measured, a defect in the line width of the metal patterns in the logic circuit device may be detected.

FIG. 25 illustrates defects occurring in the fifth type of macro pattern.

Referring to FIG. 25, in manufacturing processes of the logic circuit device, defects in which the line width of the second end of the color 1 pattern may be greater than a target line width (i.e., second line width) may occur.

In this case, in the fifth type of macro pattern 200e, the second end of each of the first and third conductive lines 220b, 224b, which are the color 1 patterns, may have a line width greater than the second line width.

Also, in the fifth type of macro pattern 200e, a portion of the second conductive line 222 facing the second ends of the first and third conductive lines 220b and 224b may have a line width less than the second line width locally. When the line width of the second end of at least one of the first and third conductive lines 220b and 224b excessively increases, a portion of the second conductive line 222 facing the second ends of the first and third conductive lines 220b and 224b may be cut off. Thus, a resistance of the second conductive line 222 may be increased and/or the second conductive line 222 may be disconnected or have an open-circuit.

In the fifth type of macro pattern 200e, the line width of each of the first to third conductive lines 220b, 222, and 224b may be measured. In this case, the line width of the second conductive line 222 may be measured at portions facing the second ends of the first and third conductive lines 220b and 224b. When the line width of each of the first to third conductive lines 220b, 222 and 224b is out of a range of an allowable line width, the conductive line may be determined as defective.

As the line widths of the conductive lines included in the fifth type of macro pattern 200e is measured, a defect of the line width of the metal patterns in the logic circuit device may be detected.

Figure 26:
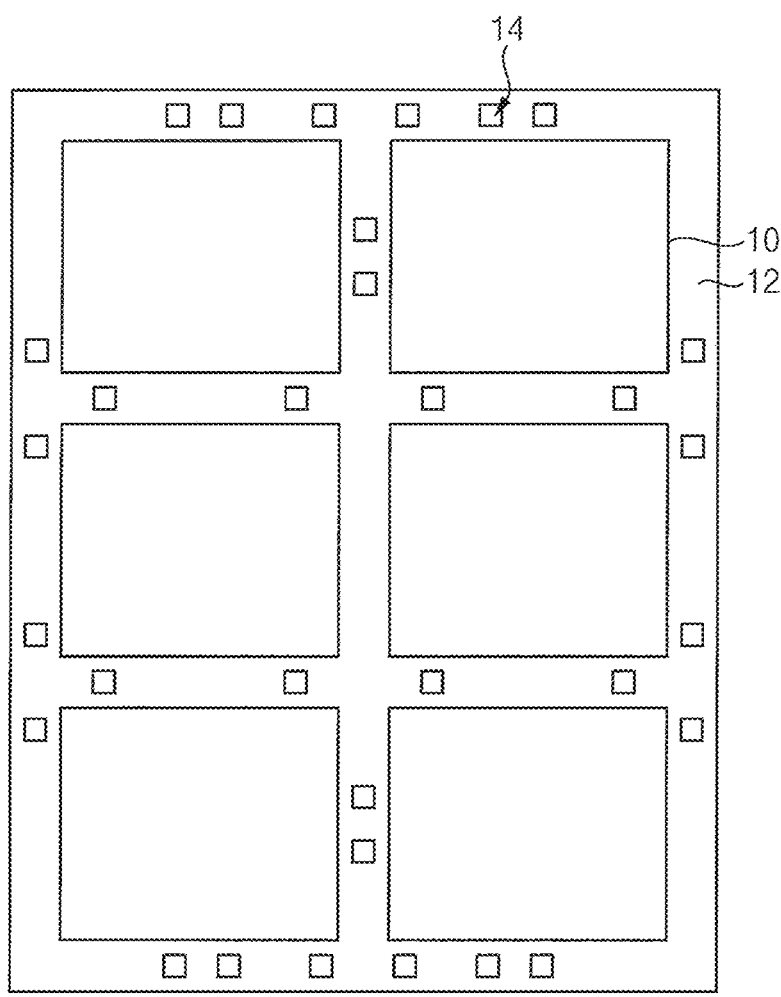

FIG. 26 is a plan view illustrating a semiconductor chip including a macro pattern structure for monitoring of a line width of a pattern in accordance with various example embodiments.

Referring to FIG. 26, a substrate may include device regions 10 for forming a logic circuit device in a semiconductor chip. The substrate may include a scribe lane region 12 or scribe line region 12 surrounding the device regions 10.

Circuit patterns and metal patterns electrically connected to the circuit patterns may be formed in the device regions 10.

A plurality of macro pattern structures 14 including one or more of the first to fifth types of macro patterns may be formed in the scribe lane region 12. In various example embodiments, each of the macro pattern structure 14 may include the first to fifth types of macro patterns spaced apart from each other and arranged in one direction.

The macro pattern structures 14 may be regularly and repeatedly disposed in the scribe lane region 12. The macro pattern structures 14 may be disposed at various portions within the scribe lane region 12. Therefore, a tendency of a defect of the metal pattern depending on each position in the semiconductor chip may be inferred.

Figure 27:
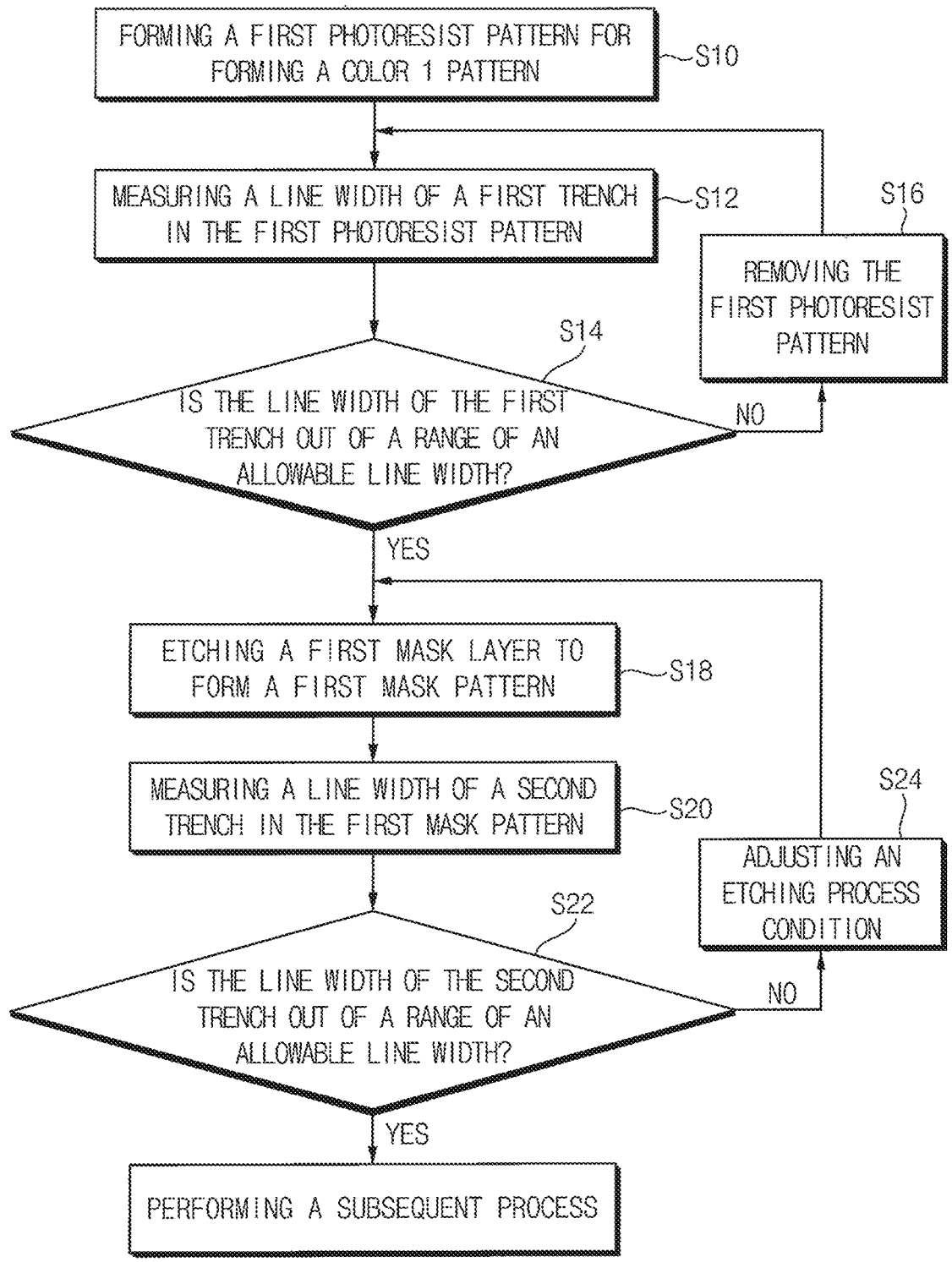
Figure 28:
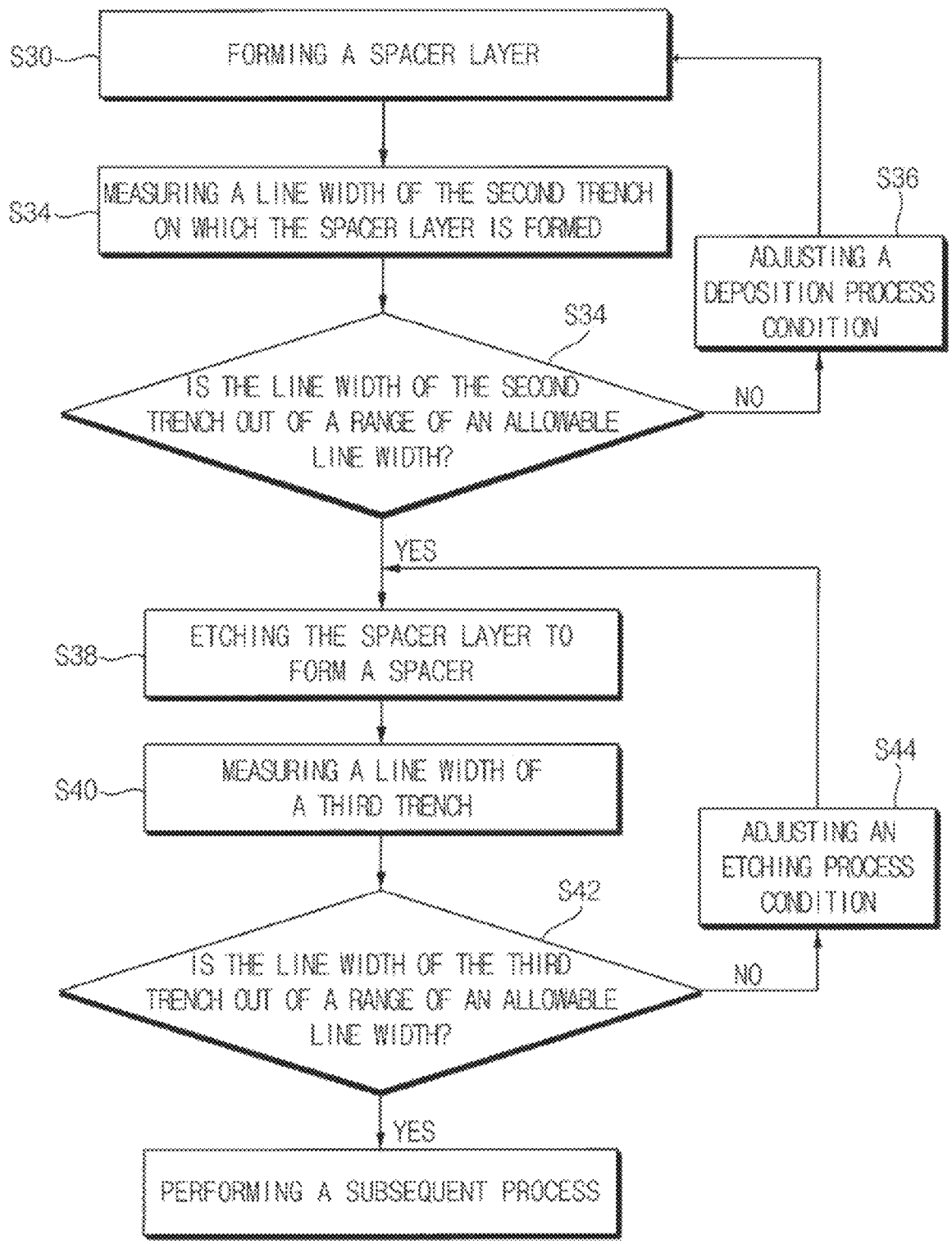

FIGS. 27 and 28 are flow charts illustrating a method for monitoring of a line width of a pattern in accordance with various example embodiments.

In the manufacturing or fabrication of the logic circuit device, when the metal patterns electrically connected to the circuit patterns are formed in the device region, the first to fifth types of macro patterns 200a, 200b, 200c, 200d, and 200e may be formed together. In addition, during the process of forming the metal patterns and the first to fifth types of macro patterns 200a, 200b, 200c, 200d, and 200e, a monitoring process of the line width and a feedback may be performed. Thus, defects in the metal patterns may be decreased. The monitoring process of the line width may be performed at the first to fifth types of macro patterns 200a, 200b, 200c, 200d, and 200e. The monitoring process of the line width may include measuring of the line width and checking whether the line width may be out of a range of an allowable line width.

Particularly, referring to FIG. 27, first, a first photoresist pattern including a first trench may be formed by a first photo process for forming the color 1 pattern. (S10) A line width (i.e., inner width) of the first trench in the first photoresist pattern may be measured. (S12)

It may be confirmed whether the line width of the first trench is out of a range of an allowable line width. (S14)

When the line width of the first trench is out of the range of the allowable line width, the first photoresist pattern may be removed and a first photo process may be performed again. (S16) After that, a process for monitoring of the line width of the first trench may be performed in the same manner.

When the line width of the first trench is in the range of the allowable line width, a subsequent process (i.e., etching process) may be performed. That is, a mask layer may be etched using the first photoresist pattern as an etching mask to form a first mask pattern. (S18)

A line width of a second trench included in the first mask pattern is measured. (S20) It may be confirmed whether the line width of the second trench is out of a range of an allowable line width. (S22)

When the line width of the second trench is out of the range of the allowable line width, an etching process condition may be adjusted. (S24) When the line width of the second trench is in the range of the allowable line width, subsequent processes may be performed.

Referring to FIG. 28, a spacer layer may be conformally formed on surfaces of the first mask pattern and an intermetal dielectric layer. (S30) When the spacer layer may be formed, an inner width of the second trench may be decreased by the spacer layer.

Next, the line width (i.e., the inner width) of the second trench on which the spacer layer is formed may be measured. (S32). It may be confirmed whether the line width of the second trench is out of a range of an allowable line width. (S34)

When the line width of the first trench is out of the range of the allowable line width, the deposition process conditions of the spacer layer may be adjusted. (S36) When the line width of the second trench is in the range of the allowable line width, a subsequent process may be performed.

For example, the spacer layer may be anisotropically etched to form a spacer on the sidewall of the second trench. (S38) A third trench may be formed between the spacers. A line width of the third trench may be measured. (S40) When the line width of the third trench is out of the range of the allowable line width, an etching process condition of the spacer layer may be adjusted. (S42 and S44)

When the line width of the first trench is in the range of the allowable line width, a subsequent process for forming the color 2 pattern may be performed.

As such, the monitoring of the line width may be performed at each step that may affect the line width of the color 2 pattern. The monitoring of the line width may be performed at a region where the first to fifth types of macro patterns 200a, 200b, 200c, 200d, and 200e may be formed.

In various example embodiments, the monitoring of the line width may be performed in forming the first photoresist pattern for forming the color 1 pattern, forming the second mask pattern, forming the spacer layer, and forming the spacer.

As described above, the defect of the line width of the metal patterns may be detected by the monitoring the first to fifth types of macro patterns 200a, 200b, 200c, 200d, and 200e. Thus, asymmetry of line widths of the metal patterns may be decreased.

The foregoing is illustrative of some example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims. Furthermore example embodiments are not necessarily mutually exclusive with one another. For example, some example embodiments may include one or more features described with reference to one or more figures, and may also include one or more other features described with reference to one or more other figures.

What is claimed is:
1. A semiconductor device, comprising:
a metal pattern within a device region of a substrate; and a macro pattern structure within a scribe lane region of the substrate, wherein the macro pattern structure includes a plurality of types of macro patterns, wherein each type of macro pattern of the plurality of types of macro patterns includes a first pattern and a second pattern adjacent to the first pattern, wherein the first pattern and the second pattern each include at least one conductive line extending in a first direction that is parallel to a surface of the substrate, wherein the first pattern and the second pattern are arranged alternately in a second direction perpendicular to the first direction and parallel to the surface of the substrate, and wherein the first pattern and the second pattern are different from one another.

2. The semiconductor device of claim 1, wherein each type of macro pattern of the plurality of types of macro patterns is in a unit standard cell region, and, wherein, in a first type of macro pattern of the plurality of types of macro pattern, a first end and a second end of the at least one conductive line of the first pattern or the second pattern of the first type of macro pattern in the first direction are positioned at respective edges of the unit standard cell region.

3. The semiconductor device of claim 1, wherein each type of macro pattern of the plurality of types of macro patterns is in a unit standard cell region, and wherein, in a first type of macro pattern of the plurality of types of macro patterns, the at least one conductive line of the first pattern or the second pattern of the first type of macro pattern has a first length in the first direction, and the first length is the same as a length of the unit standard cell region in the first direction.

4. The semiconductor device of claim 1, wherein each type of macro pattern of the plurality of types of macro patterns is in a unit standard cell region, and wherein, in a first type of macro pattern of the plurality of types of macro pattern, one end in the first direction of the at least one conductive line of the first pattern of the first type of macro pattern is arranged at an inner portion of the unit standard cell region.

5. The semiconductor device of claim 4, wherein, in the first type of macro pattern, the at least one conductive line of the first pattern has a second length less than a first length, wherein the first length is a length in the first direction of the unit standard cell region, and wherein the at least one conductive line of the second pattern of the first type of macro pattern has the first length.

6. The semiconductor device of claim 4, wherein the at least one conductive line of the first pattern of the first type of macro pattern comprises two conductive lines, and wherein ends of the two conductive lines are not aligned to each other along the second direction.

7. The semiconductor device of claim 4, wherein the at least one conductive line of the first pattern of the first type of macro pattern comprises, and wherein ends of the two conductive lines are aligned to each other along the second direction.

8. The semiconductor device of claim 1, wherein:

each type of macro pattern of the plurality of types of macro patterns further includes a first power rail and a second power rail, and the first power rail and the second power rail extend in the first direction, and the at least one conductive line of the first pattern and the second pattern of each type of macro pattern are arranged in a region between the first power rail and the second power rail of the macro pattern.

9. The semiconductor device of claim 1, wherein;

the plurality of types of macro patterns includes first to fifth types of macro patterns, in the first to third types of macro patterns, the at least one conductive line of the first pattern or the second pattern has a first length in the first direction, and in the fourth and fifth types of macro patterns, the at least one conductive line of the first pattern has a second length in the first direction that is less than the first length, and the at least one conductive line of the second pattern has the first length in the first direction.

10. The semiconductor device of claim 1, wherein the macro pattern structure is regularly and repeatedly disposed in the scribe lane region of the substrate.

11. The semiconductor device of claim 1, wherein the first pattern and the second pattern included in each type of macro pattern of the plurality of types of macro patterns are formed by a double patterning process.

12. A semiconductor device, comprising:

a metal pattern in a device region of a substrate; and a macro pattern structure in a scribe lane region of the substrate, wherein the macro pattern structure includes first to fifth types of macro patterns, wherein each type of macro pattern of the first to fifth types of macro patterns includes a first pattern and a second pattern adjacent to the first pattern, wherein the first pattern and the second pattern each include at least one conductive line extending in a first direction parallel to a surface of the substrate, wherein the first pattern and the second pattern are alternately arranged in a second direction perpendicular to the first direction and parallel to the surface of the substrate, wherein the at least one conductive line of the first pattern and the second pattern of the first to third types of macro patterns have a first length in the first direction, and wherein, in the fourth and fifth types of macro patterns, the at least one conductive line of the first pattern has a second length in the first direction that is less than the first length, and the at least one conductive line of the second pattern has the first length in the first direction.

13. The semiconductor device of claim 12, wherein the first pattern of the fourth type of macro pattern comprises two conductive lines, and ends of the two conductive lines are not aligned to each other along the second direction.

14. The semiconductor device of claim 12, wherein the first pattern of the fifth type of macro pattern comprises two conductive lines, and ends of the two conductive lines are aligned to each other along the second direction.

15. The semiconductor device of claim 12, wherein the first pattern of the fourth and fifth types of macro patterns includes two conductive lines within a unit standard cell region, and the second pattern of the fourth and fifth types of macro patterns includes one conductive line within the unit standard cell region.

16. The semiconductor device of claim 12, wherein the macro pattern structure is regularly and repeatedly disposed in the scribe lane region of the substrate.

17. A semiconductor device, comprising:

a first macro pattern in a unit standard cell region, the first macro pattern including three or five conductive lines extending in a first direction, wherein the three or five conductive lines of the first macro pattern are spaced apart from each other in a second direction perpendicular to the first direction and have a first length in the first direction; and a second macro pattern in the unit standard cell region, the second macro pattern including three conductive lines extending in the first direction, wherein the three conductive lines of the second macro pattern are spaced apart from each other in the second direction, and wherein two conductive lines of the three conductive lines of the second macro pattern have a second length in the first direction that is less than the first length.

18. The semiconductor device of claim 17, wherein, in the second macro pattern, ends of the two conductive lines of the three conductive lines of the second macro pattern are not aligned to each other along the second direction.

19. The semiconductor device of claim 17, wherein in the second macro pattern, ends of the two conductive lines of the three conductive lines of the second macro pattern are aligned to each other along the second direction.

20. The semiconductor device of claim 17, wherein the five conductive lines of the first macro pattern and the three conductive lines of the second macro pattern are formed by a double patterning process.

* * * * *